United States Patent
Kato

(10) Patent No.: US 9,515,661 B2
(45) Date of Patent: Dec. 6, 2016

(54) CIRCUIT, SEMICONDUCTOR DEVICE, AND CLOCK TREE

(71) Applicant: Semiconductor Energy Laboratory Co., Ltd., Atsugi-shi, Kanagawa-ken (JP)

(72) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/705,619

(22) Filed: May 6, 2015

(65) Prior Publication Data

US 2015/0326225 A1 Nov. 12, 2015

(30) Foreign Application Priority Data

May 9, 2014 (JP) ................. 2014-098150

(51) Int. Cl.
*H03K 19/0185* (2006.01)
*H03K 19/00* (2006.01)
(Continued)

(52) U.S. Cl.
CPC ... *H03K 19/018521* (2013.01); *H01L 27/0629* (2013.01); *H01L 27/1225* (2013.01);
(Continued)

(58) Field of Classification Search
CPC ............... H03K 3/012; H03K 19/0013; H03K 19/17772; H03K 19/0008; H03K 19/0016; H03K 19/173; H03K 19/17784; H03K 23/44; H03K 23/52; H03K 19/0175; H03K 19/017509; H03K 19/017518; H03K 19/017554; H03K 19/01806; H03K 19/018507; H03K 19/082; H03K 19/09418; H03K 19/09448; H03K 19/212; H03K 2005/00163; H03K 5/2436; H03K 19/018521; G06F 1/32; G06F 2207/3872; G11C 27/024; H01L 29/2206; H01L 27/0688

See application file for complete search history.

(56) References Cited

U.S. PATENT DOCUMENTS 6,822,481 B1 11/2004 Srikantam et al.
8,434,047 B1 4/2013 Jiang et al.
(Continued)

FOREIGN PATENT DOCUMENTS

JP 2006-287552 A 10/2006
JP 2008-053976 A 3/2008
(Continued)

*Primary Examiner* — Vibol Tan
(74) *Attorney, Agent, or Firm* — Fish & Richardson P.C.

(57) ABSTRACT

A circuit with a reduced leakage current is provided. A first transistor, a third transistor, and a second transistor are electrically connected in this order in series, a drain of the second transistor and a source of the third transistor are electrically connected to each other and are electrically connected to an output node. The first transistor is a p-channel transistor. The second and third transistors are n-channel transistors each including a semiconductor region including an oxide semiconductor. The third transistor functions as a switch that controls electrical connection between a drain of the first transistor and an output node of the circuit. In the standby mode, the third transistor is in an off state.

10 Claims, 19 Drawing Sheets

(51) Int. Cl.
 *H03K 3/012* (2006.01)
 *H01L 29/24* (2006.01)
 *H01L 29/04* (2006.01)
 *H01L 27/06* (2006.01)
 *H01L 27/12* (2006.01)

(52) U.S. Cl.
 CPC ............ *H01L 29/045* (2013.01); *H01L 29/24* (2013.01); *H03K 3/012* (2013.01); *H03K 19/0008* (2013.01); *H03K 19/0013* (2013.01); *H03K 19/0016* (2013.01)

(56) References Cited

U.S. PATENT DOCUMENTS

| | | | |
|---|---|---|---|
| 8,446,171 | B2 | 5/2013 | Takahashi |
| 8,476,948 | B2 * | 7/2013 | Jain ................ H03K 3/3565 327/112 |
| 8,656,326 | B1 | 2/2014 | Rahim et al. |
| 8,769,332 | B2 | 7/2014 | Ziesler et al. |
| 8,791,516 | B2 * | 7/2014 | Ohshima ............ H01L 27/0605 257/296 |
| 8,809,850 | B2 * | 8/2014 | Yamazaki ........... H01L 27/0688 257/43 |
| 8,901,559 | B2 * | 12/2014 | Yamazaki ........... H01L 27/0688 257/43 |
| 8,981,815 | B2 | 3/2015 | Gururajarao |
| 2006/0220722 | A1 | 10/2006 | Komura et al. |
| 2011/0089417 | A1 | 4/2011 | Yamazaki et al. |
| 2011/0102018 | A1 | 5/2011 | Shionoiri et al. |
| 2012/0236221 | A1 * | 9/2012 | Kimura ............ H01L 29/66757 349/38 |
| 2012/0292616 | A1 * | 11/2012 | Ohshima ............. H01L 27/0605 257/43 |
| 2012/0297220 | A1 * | 11/2012 | Kato .................... G06F 7/5016 713/320 |
| 2013/0191673 | A1 | 7/2013 | Koyama et al. |
| 2013/0262896 | A1 | 10/2013 | Yoneda |
| 2013/0285711 | A1 | 10/2013 | Miyake |
| 2014/0167041 | A1 | 6/2014 | Yamazaki et al. |
| 2014/0208142 | A1 | 7/2014 | Tamura |
| 2014/0340127 | A1 | 11/2014 | Kobayashi et al. |
| 2015/0034948 | A1 * | 2/2015 | Takahashi ........... G11C 27/024 257/43 |

FOREIGN PATENT DOCUMENTS

| | | |
|---|---|---|
| JP | 2011-114817 A | 6/2011 |
| JP | 2011-120222 A | 6/2011 |

* cited by examiner

NAND41

NAND42

NAND43

NAND44

101

102

107

108

CIRCUIT, SEMICONDUCTOR DEVICE, AND CLOCK TREE

BACKGROUND OF THE INVENTION

1. Field of the Invention

One embodiment of the present invention relates to a semiconductor device, a method for driving the semiconductor device, and the like.

The technical field of one embodiment of the invention disclosed in the specification, the drawings, and the claims (hereinafter referred to as "this specification and the like") is not limited to the above-described technical field. One embodiment of the present invention relates to an object, a method, or a manufacturing method. In addition, one embodiment of the present invention relates to a process, a machine, manufacture, or a composition of matter. The technical field of one embodiment of the present invention, for example, includes devices such as a semiconductor device, a display device, a light-emitting device, a lighting device, a storage device, and a memory device; methods for driving the devices, and methods for manufacturing the devices.

2. Description of the Related Art

A problem of increase in static power consumption due to a leakage current arises with miniaturization of transistors in semiconductor devices. As a technique for reducing power consumption of semiconductor devices, a clock gating technique which stops input of a clock signal to a circuit that is not necessary for operation, and a power gating technique which blocks power supply are known. With the clock gating, dynamic power consumption can be reduced but static power consumption cannot be fully reduced.

A clock tree for supplying one clock signal to a plurality of circuits is used. For example, controlling the supply of power supply potentials to logic gate circuits included in a clock tree has been suggested for a reduction in a leakage current of the clock tree (see Patent Documents 1 to 3).

A variety of semiconductor devices that use a transistor including an oxide semiconductor in its semiconductor region (hereinafter referred to as "OS transistor") have been suggested. For example, by using an OS transistor as a transistor that is turned off in a standby mode, standby power of a logic circuit can be reduced (see Patent Document 4).

REFERENCE

Patent Document

[Patent Document 1] Japanese Published Patent Application No. 2006-287552
[Patent Document 2] Japanese Published Patent Application No. 2008-053976
[Patent Document 3] Japanese Published Patent Application No. 2011-114817
[Patent Document 4] Japanese Published Patent Application No. 2011-120222

SUMMARY OF THE INVENTION

An object of one embodiment of the present invention is to provide a novel semiconductor device, a method for driving the novel semiconductor device, or a method for manufacturing the novel semiconductor device. An object of one embodiment of the present invention is, for example, to provide a semiconductor device whose power consumption can be reduced or a semiconductor device with minimized area overhead.

Objects other than the above-described objects will be apparent from the description in this specification and the like, and other objects can be extracted from embodiments of the present invention. In the descriptions of a plurality of objects, one object does not preclude the existence of another object. In addition, one embodiment of the present invention does not necessarily achieve all of these objects.

One embodiment of the present invention is a circuit which includes an output node, a first node, a second node, a first transistor, a second transistor, and a third transistor. In the circuit, the circuit has a function of performing arithmetic operation with one or more first signals and outputting a second signal from the output node. A first power supply potential is input to the first node, a second power supply potential is input to the second node, and the first power supply potential is higher than the second power supply potential. The first transistor is a p-channel transistor, and the second transistor and the third transistor are n-channel transistors. The second transistor and the third transistor include semiconductor regions including an oxide semiconductor layer. The first transistor, the third transistor, and the second transistor are electrically connected in this order in series. A source of the first transistor is electrically connected to the first node, a drain of the second transistor is electrically connected to the output node, and a source of the second transistor is electrically connected to the second node. Potentials of gates of the first transistor and the second transistor are controlled by the one or more first signals, and a third signal is input to a gate of the third transistor.

In the above embodiment, the third transistor can be replaced by a p-channel transistor. Furthermore, the circuit can perform the arithmetic operation such as NOT operation, NAND operation, or NOR operation.

In this specification and the like, ordinal numbers such as first, second, and third are used to avoid confusion among components, and the terms do not limit the components numerically or do not limit the order.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

A transistor includes three nodes (terminals) called a gate, a source, and a drain. A gate is a node functioning as a control node that controls the conduction state of the transistor. Depending on the channel type of the transistor or levels of potentials applied to the nodes (terminals), one of a pair of nodes (an input node and an output node) functions as a source and the other functions as a drain. In general, in an n-channel transistor, a node to which a low potential is applied is referred to as a source, and a node to which a high potential is applied is referred to as a drain. In contrast, in a p-channel transistor, a node to which a low potential is applied is referred to as a drain, and a node to which a high potential is applied is referred to as a source.

In this specification and the like, to clarify a circuit configuration and circuit operation, one of two nodes (an input node and an output node) of a transistor is fixed as a source and the other is fixed as a drain in some cases. It is needless to say that, depending on a driving method, the magnitude relationship between potentials applied to three terminals of the transistor might be changed, and the source and the drain might be interchanged. Thus, in one embodiment of the present invention, the distinction between the source and drain of the transistor is not limited to that described in this specification and the drawings.

Note that in this specification and the like, when it is explicitly described that X and Y are connected, the case where X and Y are electrically connected, the case where X and Y are functionally connected, and the case where X and Y are directly connected are included therein. Accordingly, a connection relation other than the predetermined connection relation, for example, a connection relation other than that described in this specification and the like, is also allowed. Here, X and Y are each assumed to be an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, and/or a load) can be connected between X and Y. A switch has a function of being controlled to be on or off. That is, a switch is conducting (on state) or not conducting (off state) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. When a signal output from X is transmitted to Y, it can be said that X and Y are functionally connected even if another circuit is provided between X and Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, a layer, or the like).

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be obvious even when the connection portions are not specified. Further, in the case where a connection portion is disclosed in this specification and the like, it can be determined in some cases that one embodiment of the invention in which a connection portion is not specified is disclosed in this specification and the like. In particular, in the case where the number of portions to which a terminal is connected might be more than one, it is not necessary to limit the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least a connection portion of a circuit is specified. Alternatively, it might be possible for those skilled in the art to specify the invention when at least a function of a circuit is specified. In other words, when a function is specified, an embodiment of the invention can be obvious. Further, it can be determined that one embodiment of the invention whose function is specified is disclosed in this specification and the like. Therefore, when a connection portion of a circuit is specified, the circuit is disclosed as one embodiment of the invention even when a function of the circuit is not specified, and one embodiment of the invention can be constituted. Alternatively, when a function of a circuit is specified, the circuit is disclosed as one embodiment of the invention even when a connection portion is not specified, and one embodiment of the invention can be constituted.

With one embodiment of the present invention, a novel semiconductor device, a method for driving the novel semiconductor device, or a method for manufacturing the novel semiconductor device can be provided. For example, with one embodiment of the present invention, power consumption of a semiconductor device can be reduced or area overhead of a semiconductor device can be minimized.

Note that the description of these effects does not disturb the existence of other effects. One embodiment of the present invention does not necessarily have all of these effects. In addition, the effects of one embodiment of the present invention are not limited to these effects. For example, depending on circumstances or conditions, one embodiment of the present invention might not have these effects or might have an effect other than these effects. In one embodiment of the present invention, an object other than the above objects, an effect other than the above effects, and a novel structure will be apparent from the description in this specification and the like.

DETAILED DESCRIPTION OF THE INVENTION

Figure 1A:
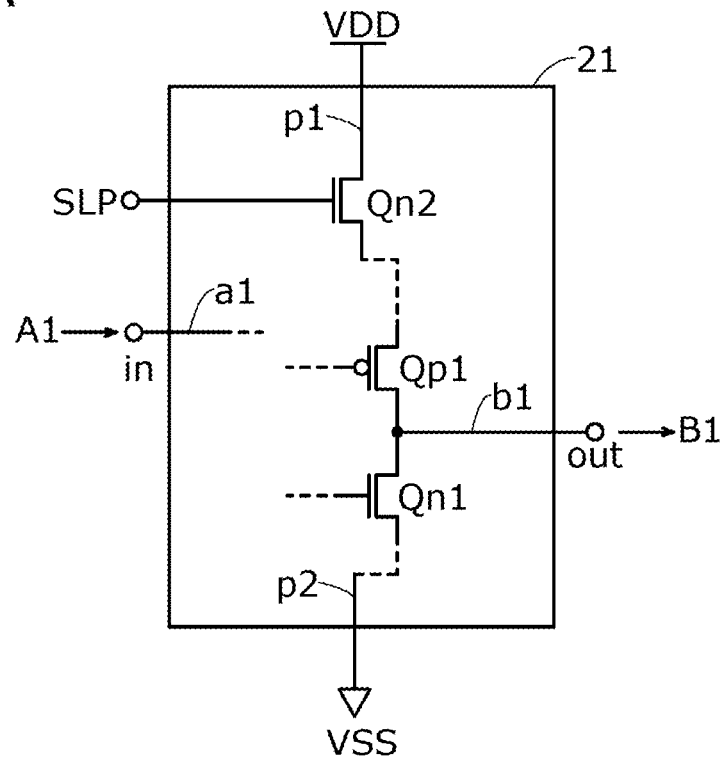
FIGS. 1A and 1B are block diagrams each illustrating a configuration example of a semiconductor device.

Embodiments of the present invention will be described in detail with reference to the accompanying drawings. One embodiment of the present invention is not limited to the following description, and it is easily understood by those skilled in the art that modes and details disclosed herein can be modified in various ways without departing from the spirit and the scope of one embodiment of the present invention. Therefore, one embodiment of the present invention is not interpreted as being limited to the description of the embodiments described below.

Some embodiments will be described below. A structure described in one embodiment can be combined with a structure described in any of the other embodiments as appropriate. In addition, in the case where some structure examples are described in one embodiment, the structure examples can be combined as appropriate.

In the drawings used for the description of embodiments of the present invention, the same portions or portions having a similar function are denoted by the same reference numerals, and the repeated description thereof is omitted in some cases. In this specification, the clock signal CLK is abbreviated as "a signal CLK," "CLK," or the like in some cases. The same applies to other components (e.g., signal, voltage, potential, circuit, element, electrode, and wiring).

Note that in some cases in this specification and the like, a high-level potential of a signal is expressed as "H", and a low-level potential of a signal is expressed as "L".

Embodiment 1

Structure Example of Semiconductor Device

A semiconductor device capable of power gating will be described. FIGS. 1A and 1B and FIGS. 2A and 2B illustrate configuration examples of a semiconductor device. The semiconductor devices illustrated in FIGS. 1A and 1B and FIGS. 2A and 2B can reduce a leakage current in a standby mode by including a switch that can block the supply of a high power supply potential VDD to an output node. In this specification, a switch having a function of controlling the supply of a power supply potential to a circuit is referred to as a "power switch".

Structure Example 1

A high power supply potential VDD and a low power supply potential VSS are supplied to a circuit 21 illustrated in FIG. 1A. The circuit 21 is a CMOS circuit including both n-channel transistors and a p-channel transistor and includes at least two n-channel transistors (a transistor Qn1 and a transistor Qn2) and one p-channel transistor (a transistor Qp1). The transistor Qn2 can function as a power switch that controls power gating of the circuit 21.

That is, the circuit 21 is a functional circuit provided with a power switch. In the functional circuit, a logic gate circuit capable of basic logical operation can be used. Examples of the logic gate circuit that can be used in the circuit 21 include an inverter circuit (NOT gate circuit), a NAND gate circuit, a NOR gate circuit, an AND gate circuit, an OR gate circuit, and a buffer circuit.

In the example of FIG. 1A, the circuit 21 can function as a 1-input 1-output logic circuit and processes a signal A1 input from an input node a1 and outputs a signal B1 from an output node b1. The number of input nodes in the circuit 21 may be more than one. The circuit 21 includes a node p1 and a node p2. VDD is input to the node p1, and VSS is input to the node p2.

The transistor Qp1 and the transistor Qn1 are transistors constituting a logic circuit portion of the circuit 21. A drain of the transistor Qp1 and a drain of the transistor Qn1 are electrically connected to each other and are electrically connected to the output node b1. A source of the transistor Qn1 is electrically connected to the node p2. The electrical connection between the source of the transistor Qn1 and the node p2 may be direct or indirect via another element such as a transistor. The potentials of gates of the transistor Qp1 and the transistor Qn1 are determined by the signal A1, and the logical level of the node b1 is determined by the potentials of the gates of the transistor Qp1 and the transistor Qn1.

The transistor Qn2 is provided to block the supply of VDD to a source of the transistor Qp1. The transistor Qn2 can function as a power switch that controls the supply of VDD to the source of the transistor Qp1. A drain of the transistor Qn2 is electrically connected to the node p1. A source of the transistor Qn2 is electrically connected to the source of the transistor Qp1. The electrical connection between the source of the transistor Qn1 and the source of the transistor Qp1 may be direct or indirect via another element such as a transistor. A signal SLP is a control signal for controlling the conduction state of the transistor Qn2.

Furthermore, the transistor Qn2 can function as a power switch that controls electrical connection between a wiring for supplying VDD and the circuit 21.

In normal operation of the circuit 21, the signal SLP is set at a high-level potential ("H") to turn on the transistor Qn2. In the circuit 21, logical operation is performed. When the circuit 21 is brought into a standby mode, the signal SLP is set at a low-level potential ("L") to turn off the transistor Qn2. In the case where the standby mode is made when the gate of the transistor Qp1 is at "H" and thus the transistor Qp1 is off, the supply of a high-level potential to the source of the transistor Qp1 is blocked, so that a leakage current between the source and the drain of the transistor Qp1 can be eliminated or reduced.

In the case where the circuit 21 is brought into a standby mode when the gate of the transistor Qn1 is at "L", a transistor having an extremely low off-state current is used as the transistor Qn1 in order to eliminate or reduce the leakage current between the source and the drain of the transistor Qn1. The off-state current refers to a drain current in an off state.

To reduce off-state current of a transistor, a semiconductor region may include a semiconductor with a wide energy gap, for example. In that case, the energy gap of the semiconductor is preferably greater than or equal to 2.5 eV, greater than or equal to 2.7 eV, or greater than or equal to 3 eV. An example of such a semiconductor is an oxide semiconductor. The off-state current of an OS transistor normalized on the channel width can be, for example, lower than or equal to $10 \times 10^{-21}$ A/μm (10 zA/μm) with a source-drain voltage of 10 V at room temperature (approximately 25° C.).

According to our research, under present circumstances, OS transistors whose semiconductor regions include an oxide semiconductor, of only n-channel type have characteristics that are practical for the incorporation in the same circuit together with Si transistors. Therefore, OS transistors are used as the transistor Qn1 and the transistor Qn2. Moreover, to effectively reduce the leakage current of the circuit 21, all the n-channel transistors in the circuit 21 are preferably n-channel OS transistors. The leakage current of the OS transistors in the circuit 21 is preferably lower than or equal to $1 \times 10^{-15}$ A, lower than or equal to $1 \times 10^{-18}$ A, or lower than or equal to $1 \times 10^{-21}$ A at 85° C.

The material of the semiconductor region of the p-channel transistor in the circuit 21 is not particularly limited. For example, the semiconductor region of the p-channel transistor in the circuit 21 may include a semiconductor including one or more of Group 14 elements such as Si, Ge, and C or a nitride semiconductor such as gallium nitride. Typically, the p-channel transistor may be a Si transistor whose semiconductor region includes silicon.

In the case where, when the transistor Qn2 is on, the source of the transistor Qp1 becomes at an intermediate state between "H" and "L" by the influence of the threshold voltage of the transistor Qn2, the high-level potential of the signal SLP is preferably set higher than VDD. In this way, the source of the transistor Qp1 can be certainly set at "H" in a period when the circuit 21 is in a normal operation mode; accordingly, a malfunction of the circuit 21 can be prevented.

Structure Example 2

Figure 1B:
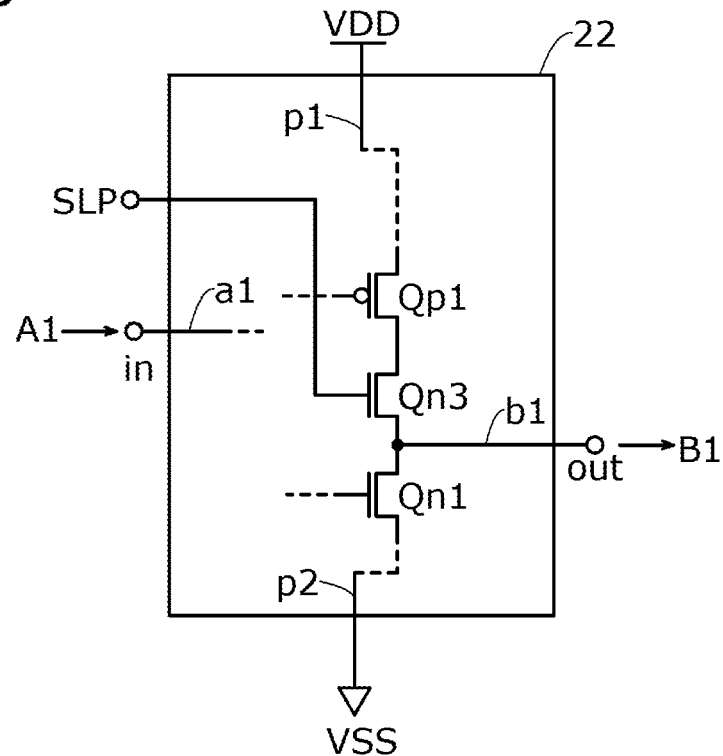

A circuit 22 illustrated in FIG. 1B is a variation of the circuit 21. Instead of the transistor Qn2, a transistor Qn3 is provided as the switch circuit for power gating. The transistor Qn3 is also an n-channel OS transistor like the transistor Qn2.

The source of the transistor Qp1 is electrically connected to the node p1. Electrical connection between the source of the transistor Qp1 and the node p1 may be direct or indirect via another element such as a transistor.

The signal SLP is input to a gate of the transistor Qn3. The transistor Qn3 functions as a switch that controls the conduction between the drain of the transistor Qn1 and the drain of the transistor Qp1. The drain of the transistor Qn3 is electrically connected to the drain of the transistor Qp1, and the source of the transistor Qn3 is electrically connected to the drain of the transistor Qn1.

By bringing the circuit 22 into a standby mode when the gate of the transistor Qn1 is at "H", power consumption of the circuit 22 can be effectively reduced. Since the standby mode is made when the gate of the transistor Qn1 is at "H", "L" of the node b1 is maintained during the standby mode. Accordingly, when the normal operation of the circuit 22 is restarted, power for restoring the state of the node b1 is not required.

In the case where the state of the node b1 becomes an intermediate state between "H" and "L" when the state of the node b1 should be "H" by the influence of the threshold voltage of the transistor Qn3, the high-level potential of the signal SLP is preferably set higher than VDD. Thus, in the normal operation of the circuit 22, a malfunction of a circuit to which the output signal B1 from the circuit 22 is input can be prevented.

Structure Examples 3 and 4

Figure 2A:
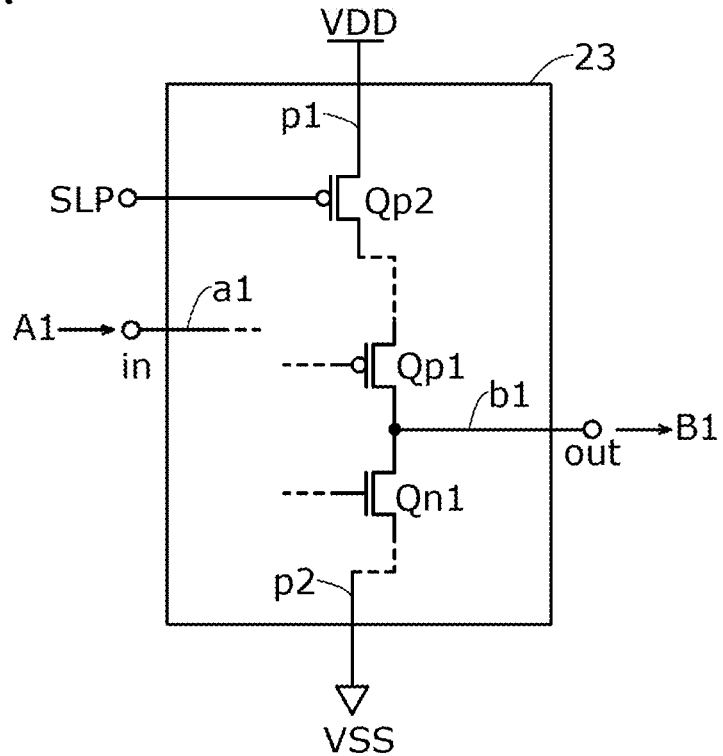
FIGS. 2A and 2B are block diagrams each illustrating a configuration example of a semiconductor device.
Figure 2B:
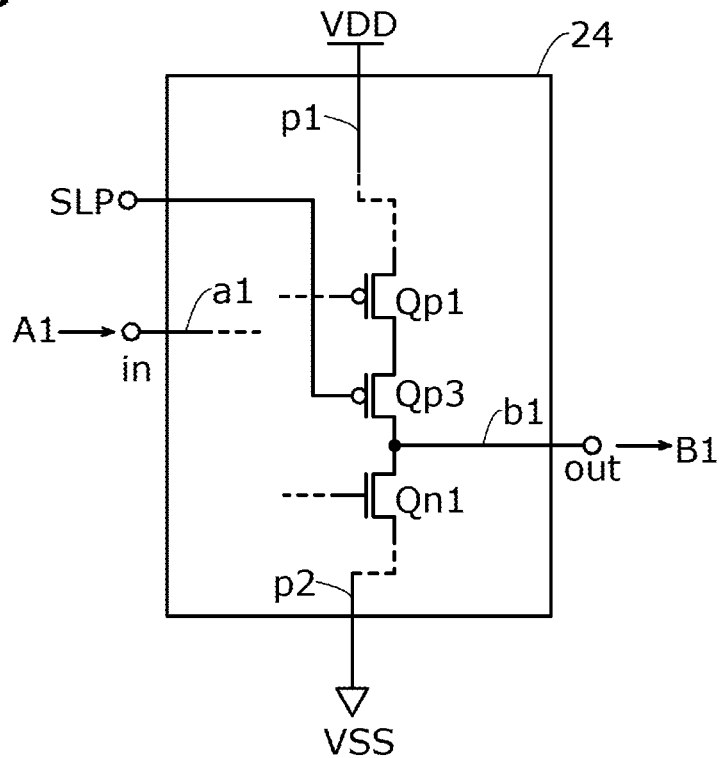

FIG. 2A illustrates a variation of the circuit 21. In a circuit 23 illustrated in FIG. 2A, a p-channel transistor (a transistor Qp2) is provided instead of the transistor Qn2. A circuit 24 illustrated in FIG. 2B is a variation of the circuit 22. In the circuit 24, a p-channel transistor (a transistor Qp3) is provided instead of the transistor Qn3.

Furthermore, in the circuits 22 and 24, a power switch is provided between the output node b1 and the drain of the transistor Qp1; accordingly, even if gate leakage occurs in the transistor Qp1 in the standby mode, the potential of the output node b1 is hardly influenced.

Since the leakage current of an OS transistor in an off state can be regarded as substantially zero, the circuits 21 and 22 where OS transistors are used as the power switches can reduce the leakage current in the standby mode more than the circuits 23 and 24.

Structure Example 5

In the circuit 21, a backgate may be provided in the transistor Qn2 functioning as a power switch. For example, the potential of the backgate may be configured to be controlled independently of the gate (front gate) of the transistor Qn2. The same can apply to the other OS transistor in the circuit 21. The potential of the backgate of the OS transistor can be changed between the on state and the off state so that an appropriate amount of drain current can flow in an on state and the leakage current can be extremely low in an off state. Note that the drain current in an on state is referred to as an on-state current, in some cases.

In order to reduce dynamic power consumption of the circuit 21, it is effective to reduce VDD. To realize that, the OS transistor preferably has high enough on-state current characteristics so that the circuit 21 can perform predetermined operation even with a low VDD. In an OS transistor with such high on-state current characteristics, the leakage current becomes large even when the potential of the gate is set at VSS, in some cases. In this case, in the standby mode, the potential of the backgate is controlled so as to reduce the leakage current of the OS transistor. Further in the normal operation mode, the potential of the backgate may be controlled so as to increase the on-state current of the OS transistor. The above description can apply to the OS transistors included in the circuits 22 to 24.

As described above, by providing a power switch that controls blocking of VDD in a circuit where arithmetic operation is performed, a leakage current of a p-channel transistor that is off in a standby mode can be reduced. Furthermore, by using OS transistors as the n-channel transistors, leakage currents of the n-channel transistors in an off state can be reduced in the standby mode. Moreover, a power switch for blocking VSS is not necessary, so that an increase in circuit area by addition of the power switch for VSS blocking is prevented and power for controlling the power switch is not necessary.

As described above, in the above structure examples, by adding a power gating function to a circuit, power consumption in the standby mode can be effectively reduced while area overhead due to the addition of the power gating function to the circuit is minimized.

<<Structure Example of Circuit>>

More specific circuit configurations of the above-described structure examples will be described below. FIGS. 3A to 3E illustrate inverter circuits which are specific examples of a 1-input 1-output circuit. FIGS. 4A to 4D and FIGS. 5A to 5D illustrate NAND gate circuits and NOR gate circuits, respectively, which are specific examples of a 2-input 1-output circuit. In the following description, an inverter, a NAND gate circuit and a NOR gate circuit are referred to as INV, NAND, and NOR, respectively, in some cases.

<Inverter Circuit>

Figure 3A:
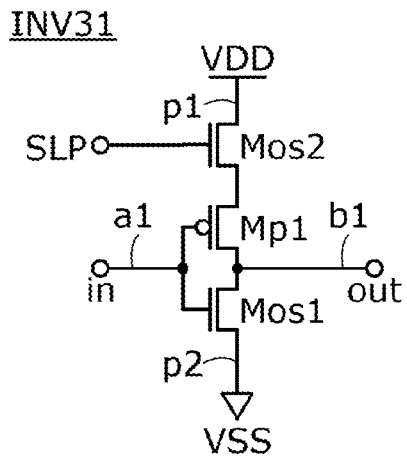
FIGS. 3A to 3E are circuit diagrams each illustrating a configuration example of a circuit.

FIG. 3A illustrates a specific example of the circuit 21. An INV 31 illustrated in FIG. 3A includes a p-channel transistor Mp1, an n-channel transistor Mos1, and an n-channel transistor Mos2. The transistors Mos1 and Mos2 are OS transistors. The transistor Mp1 and the transistor Mos1 form a CMOS inverter circuit. The transistor Mos2 is a transistor corresponding to the transistor Qn2 in FIG. 1A.

Figure 3B:
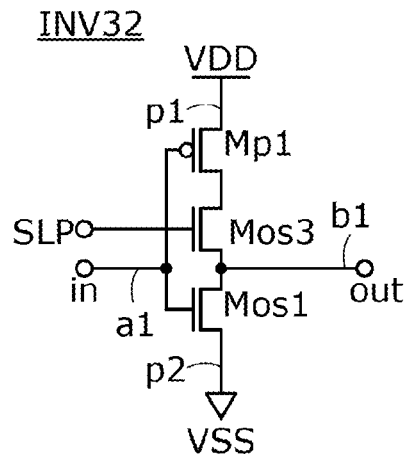

FIG. 3B illustrates a specific example of the circuit 22. An INV 32 illustrated in FIG. 3B includes the transistor Mp1, the transistor Mos1, and a transistor Mos3. The transistor Mp1 is of a p-channel type, and the transistors Mos1 and Mos3 are n-channel OS transistors. The transistor Mos3 is a transistor corresponding to the transistor Qn3 in FIG. 2B.

Figure 3C:
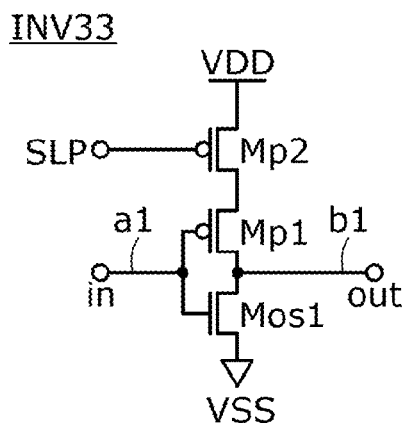

FIG. 3C illustrates a specific example of the circuit 23. An INV 33 illustrated in FIG. 3C includes the transistor Mp1, a transistor Mp2, and the transistor Mos1. The transistor Mp2 is a transistor corresponding to the transistor Qp2 in FIG. 2A.

Figure 3D:
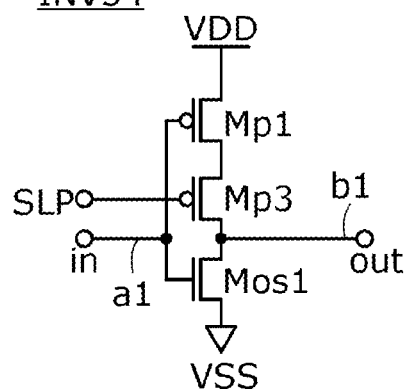

FIG. 3D illustrates a specific example of the circuit 24. An INV 34 illustrated in FIG. 3D includes the transistor Mp1, a transistor Mp3, and the transistor Mos1. The transistor Mp3 is a transistor corresponding to the transistor Qp3 in FIG. 2B.

Figure 3E:
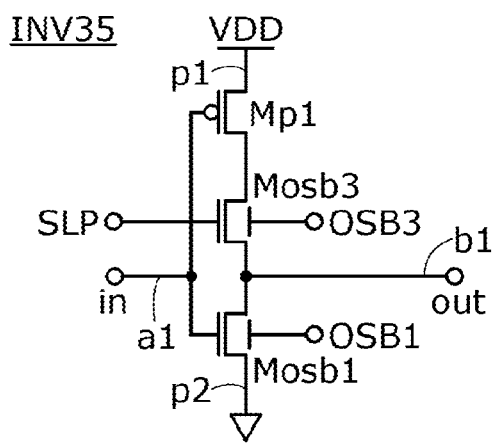

An INV 35 illustrated in FIG. 3E is a circuit corresponding to the above structure example 5 and is a variation of the INV 32. Transistors Mosb1 and Mosb3 each having a backgate are provided instead of the transistors Mos1 and Mos3. A signal OSB1 is input to the backgate of the transistor Mosb1, and a signal OSB3 is input to the backgate of the transistor Mosb3. The same control signal may be input to both the backgates of the transistors Mosb1 and Mosb3.

<NAND Gate Circuit>

Figure 4A:
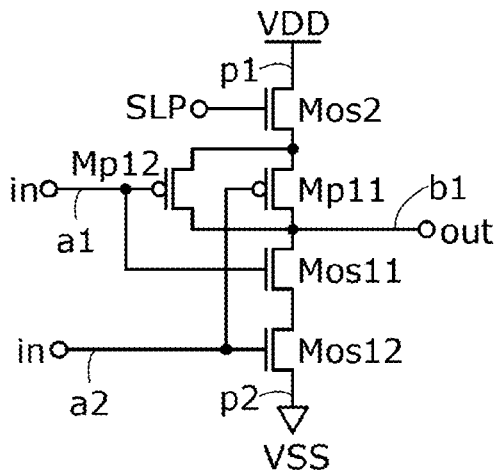
FIGS. 4A to 4D are circuit diagrams each illustrating a configuration example of a circuit.

FIG. 4A illustrates a specific example of the circuit 21. A NAND 41 illustrated in FIG. 4A includes two input nodes a1 and a2. The NAND 41 is a NAND gate circuit formed of two p-channel transistors (Mp11, Mp12) and two n-channel transistors (Mos11, Mos12), to which the transistor Mos2 is added. The n-channel transistors (Mos2, Mos11, Mos12) included in the NAND 41 are OS transistors. The transistor Mos2 functions as a switch that controls electrical connection between the node p1 and sources of the transistors Mph1 and Mp12 and also functions as a switch that can block the supply of VDD to the NAND 41.

Figure 4B:
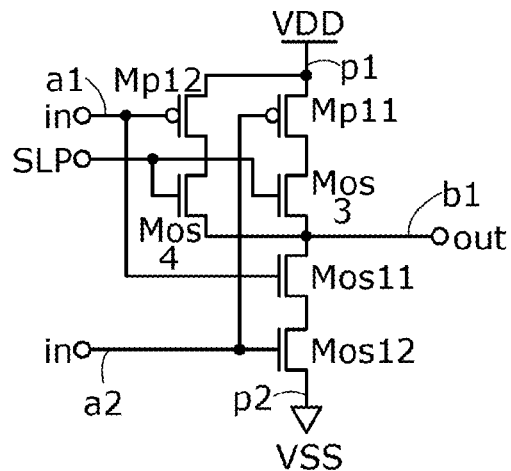

FIG. 4B illustrates a specific example of the circuit 22. A NAND 42 illustrated in FIG. 4B is a NAND gate circuit formed of two p-channel transistors (Mp11, Mp12) and two n-channel transistors (Mos11, Mos12), to which the transistor Mos3 and a transistor Mos4 are added. The transistor Mos3 functions as a switch that controls electrical connection between a drain of the transistor Mp11 and the node b1. The transistor Mos4 functions as a switch that controls electrical connection between a drain of the transistor Mp12 and the node b1. The signal SLP is input to gates of the transistors Mos3 and Mos4. That is, the transistors Mos3 and Mos4 have a function of a power switch that can block the supply of VDD to the node b1.

Figure 4C:
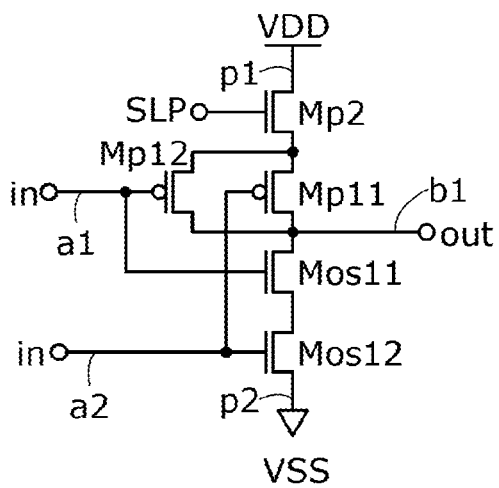

FIG. 4C illustrates a specific example of the circuit 23, which is a variation of the NAND 41. A NAND 43 illustrated in FIG. 4C includes the transistor Mp2 instead of the transistor Mos2.

Figure 4D:
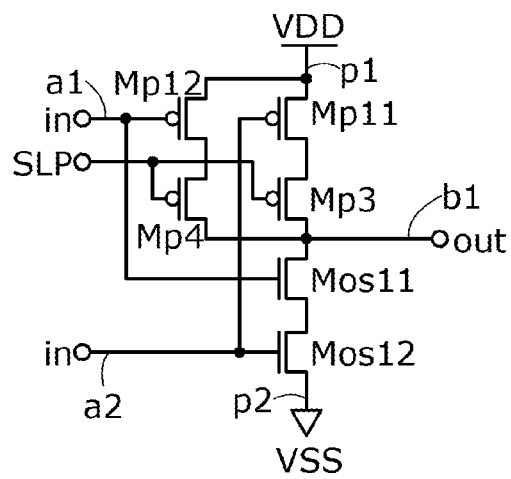

FIG. 4D illustrates a specific example of the circuit 24, which is a variation of the NAND 42. A NAND 44 illustrated in FIG. 4D includes the transistor Mp3 and a transistor Mp4 instead of the transistors Mos3 and Mos4.

Some or all of the OS transistors included in the NANDs 41 to 44 may be transistors having backgates like the transistor Mosb1 in FIG. 3E.

<NOR Gate Circuit>

Figure 5A:
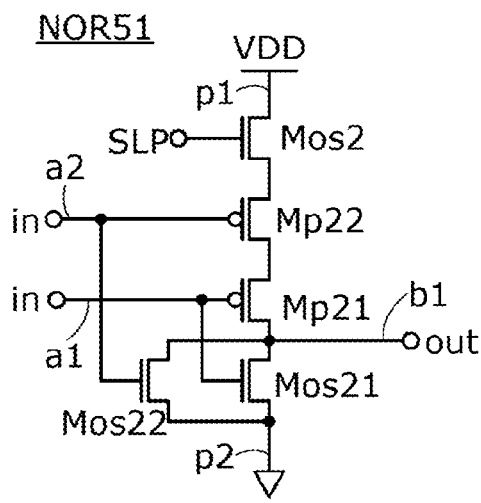
FIGS. 5A to 5D are circuit diagrams each illustrating a configuration example of a circuit.

FIG. 5A illustrates a specific example of the circuit 21. A NOR 51 illustrated in FIG. 5A is a NOR gate circuit formed of two p-channel transistors (Mp21, Mp22) and two n-channel transistors (Mos21, Mos22), to which the n-channel transistor Mos2 is added. The n-channel transistors (Mos2, Mos21, and Mos22) included in the NOR 51 are OS transistors. The transistor Mos2 functions as a switch that controls electrical connection between the node p1 and a source of the transistor Mp22.

Figure 5B:
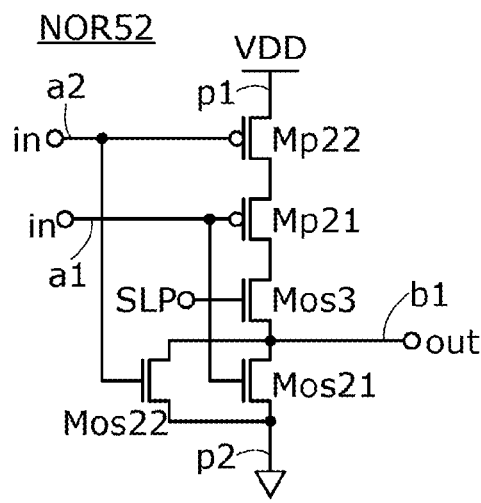

FIG. 5B illustrates a specific example of the circuit 22. A NOR 52 illustrated in FIG. 5B is a NOR gate circuit formed of two p-channel transistors (Mp21, Mp22) and two n-channel transistors (Mos21, Mos22), to which the transistor Mos3 is added. The transistor Mos3 functions as a switch that controls electrical connection between a drain of the transistor Mp21 and a drain of the transistor Mos21.

Figure 5C:
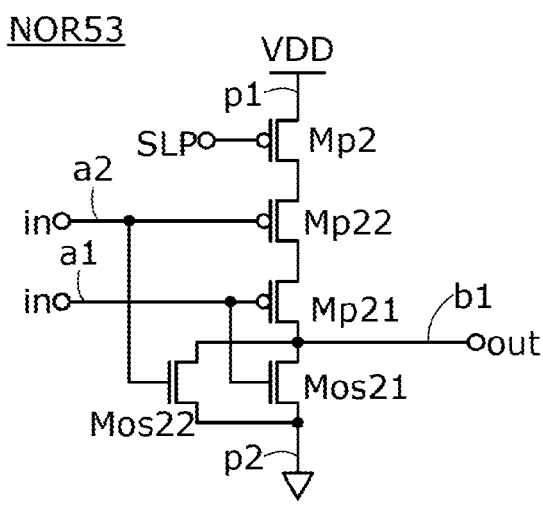

FIG. 5C illustrates a specific example of the circuit 23, which is a variation of the NOR 51. A NOR 53 illustrated in FIG. 5C includes the transistor Mp2 instead of the transistor Mos2.

Figure 5D:
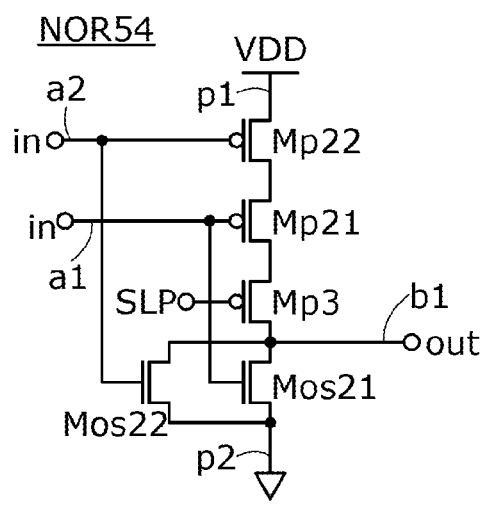

FIG. 5D illustrates a specific example of the circuit 24, which is a variation of the NOR 52. A NOR 54 illustrated in FIG. 5D includes the transistor Mp3 instead of the transistor Mos3.

Some or all of the OS transistors included in the NORs 51 to 54 may be transistors having backgates like the transistor Mosb1 in FIG. 3E.

By providing a logic cell (also referred to as standard cell) with a power gating function as in the basic logic gate circuits illustrated in FIGS. 3A to 3E, FIGS. 4A to 4D, and FIGS. 5A to 5D, fine-grained power gating can be performed. By using OS transistors as the n-channel transistors in the logic cell, the leakage current in the logic cell in the standby mode can be effectively reduced without a power switch for blocking VSS.

In a semiconductor device such as an integrated circuit, a plurality of logic cells are incorporated. Structure examples of a semiconductor device that employs the circuits 21 to 24 illustrated in FIGS. 1A and 1B and FIGS. 2A and 2B and can have effectively reduced power consumption with a suppressed increase in circuit area, and an operation example of the semiconductor device will be described below. Specifically, one of cascade-connected two circuits is provided with a power switch for blocking VDD, and the other circuit is not provided with such a power switch. Moreover, n-channel transistors included in the two stages of circuits are OS transistors. With this circuit configuration, area overhead generated by providing a semiconductor device with a power gating function can be reduced, and power consumption in the standby mode can be effectively reduced. The following description is given with reference to drawings.

Structure Example of Semiconductor Device

Structure Example 1-1

Figure 6A:
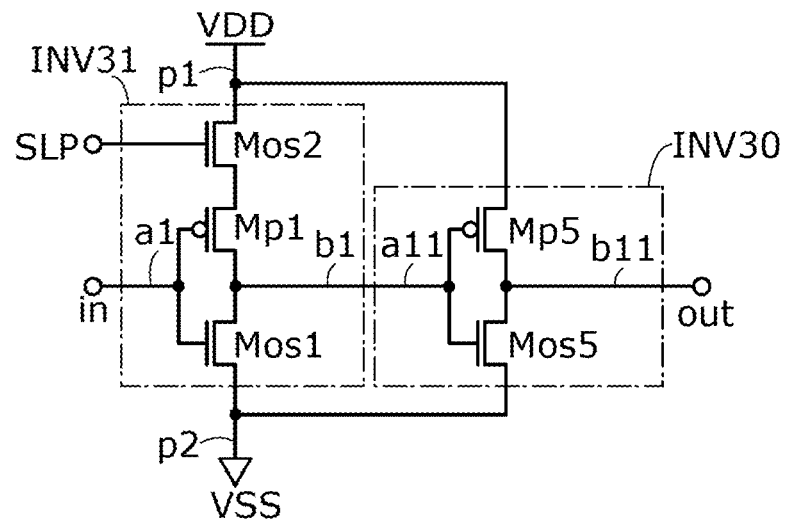
FIGS. 6A and 6B are circuit diagrams each illustrating a configuration example of a circuit.
Figure 6B:
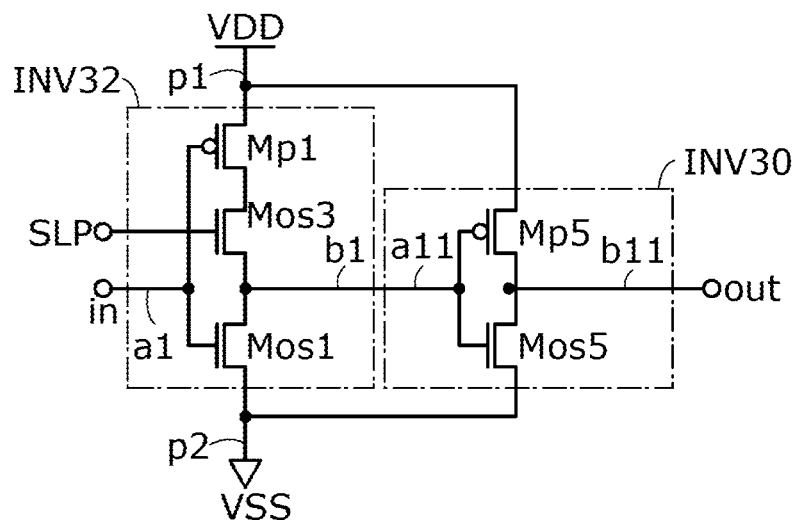

FIGS. 6A and 6B illustrate an example of cascade-connected two inverter circuits as an example of a semiconductor device.

A semiconductor device 101 illustrated in FIG. 6A includes the INV 31 and an NV 30. A high power supply potential VDD and a low power supply potential VSS are supplied to the semiconductor device 101.

The INV 30 is a normal CMOS inverter circuit that does not have a function of blocking VDD and VSS. Even when the semiconductor device 101 is in a standby mode, VDD is supplied to a source of a transistor Mp5, and VSS is supplied to a source of a transistor Mos5. The INV 30 includes an input node a11, an output node b11, the p-channel transistor Mp5, and the n-channel transistor Mos5. The n-channel transistor Mos5 is also an OS transistor. Accordingly, even when a power switch for blocking VSS is not provided, the leakage current of the n-channel transistor Mos5 can be substantially zero if the gate is at "L" in the standby mode.

An operation example in the case where the standby mode is made when the node a1 is at "H" will be described. Immediately before the signal SLP changes from "H" to "L", the node a1 is at "H", the node b1 is at "L", and the node b11 is at "H". Accordingly, in the INV 30, the transistor Mp5 is on and the transistor Mos5 is off; thus almost no leakage current flows through the INV 30 in the standby mode. While in the INV 31, the transistor Mp1 is off and the transistor Mos1 is on; thus, by setting the signal SLP to "L", the leakage current of the transistor Mp1 can be reduced. In this way, an increase in the potential of the output node b1 due to the leakage current of the transistor Mp1 can be suppressed, so that generation of a leakage current or a flow-through current in the INV 30 in the latter stage can be suppressed. Therefore, power consumption of the semiconductor device 101 as a whole in the standby mode can be reduced.

In this case, the state "H" of the node b11 is stored in the semiconductor device 101 in the standby mode. Accordingly, when the semiconductor device 101 returns to normal operation, power for charging the node b11 is not necessary, so that power consumption of the semiconductor device 101 can be reduced.

An operation example in the case where the standby mode is made when the node a1 is at "L" will be described. In the INV 31, since the transistor Mos1 is off, substantially no leakage current can flow in the INV 31. While in the INV 30, since "H" is input to the node a11, a leakage current might flow through the transistor Mp5 and thus the potential of the output node b11 might be increased. For example, in the case where an inverter circuit is connected to the output node b11, a flow-through current flows through the inverter circuit.

Since only one of the two inverter circuits is provided with a power switch in the semiconductor device 101 as described above, the effect of reducing the leakage current in the standby mode varies between when the node a1 is at "H" and when the node a1 is at "L"; the effect is smaller when the node a1 is at "L". However, the semiconductor device 101 including two stages of CMOS inverter circuits one of which is provided with one switch for blocking VDD can offer novel performance of storing the state as well as reducing the leakage current when being brought into the standby mode under the state where the node a1 is at "H". The semiconductor device 101 in FIG. 6A can have the above-described excellent effects by having the circuit configuration where one transistor for power switching is added to two stages of CMOS inverter circuits. That is, in this embodiment, the number of elements or control signals can be minimized and power consumption can be effectively reduced.

In general clock gating, the input node of the logic circuit has an unstable state when the semiconductor device is brought into the standby mode. Thus, in order to make most use of the performance of the semiconductor device 101, the node a1 is preferably set to "H" when the semiconductor device 101 is brought into the standby mode. An embodiment of the semiconductor device 101 with this function is, for example, a clock tree. The clock tree will be described later.

Structure Example 1-2

In the example of FIG. 6A, the INV 31 is used as the inverter circuit including the power switch for VDD; however, any of the inverter circuits of the other structure examples in Embodiment 1 (e.g., the INVs 32 to 35) can be used. Furthermore, the NV 30 may be provided on the input side and the inverter circuit including the power switch for VDD such as the INV 31 may be provided on the output side. FIG. 6B illustrates a variation of the semiconductor device 101. A semiconductor device 102 illustrated in FIG. 6B includes the INV 32 and the INV 30. The semiconductor device 102 can operate in a manner similar to that of the semiconductor device 101.

FIGS. 6A and 6B each illustrate an example of two stages of inverter circuits; however, an embodiment of the present invention is not limited to these examples. Other than the inverter circuits, other logic cells such as NAND gate circuits and NOR gate circuits can be used. FIGS. 7A and 7B and FIGS. 8A and 8B illustrate other examples.

Structure Example 1-3

Figure 7A:
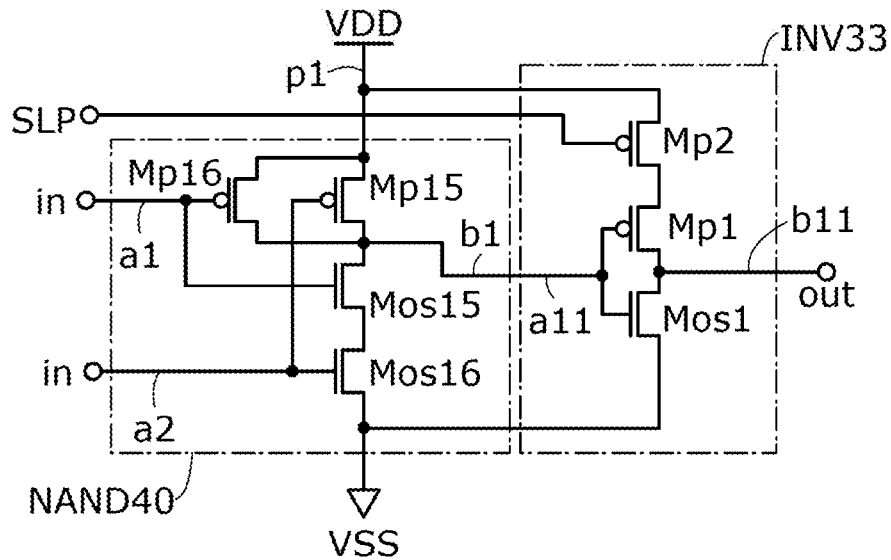
FIGS. 7A and 7B are circuit diagrams each illustrating a configuration example of a semiconductor device.

A semiconductor device 103 illustrated in FIG. 7A includes a NAND 40 and the INV 33 and functions as an AND gate circuit. The NAND 40 is a normal NAND gate circuit without having a function of blocking VDD or VSS. The NAND 40 includes two p-channel transistors (Mp15, Mp16) and two n-channel transistors (Mos15, Mos16). The transistors Mos15 and Mos16 are OS transistors. The input node a11 of the INV 33 is electrically connected to the output node b1 of the NAND 40. Instead of the INV33, the INV 31, the INV 32, or the INV34 illustrated in FIG. 3A, 3B, or 3D can be provided.

By setting the standby mode when both the node a1 and the node a2 are at "L", the power gating function of the semiconductor device 103 can be effectively utilized. In the NAND 40, the transistors Mos15 and Mos16 are off, so that substantially no leakage current flows. In the INV 33, since the input node a11 is at "H", the transistor Mp1 is off; here, by setting the transistor Mp2 in an off state, a leakage current of the transistor Mp1 can be reduced.

Structure Example 1-4

Figure 7B:
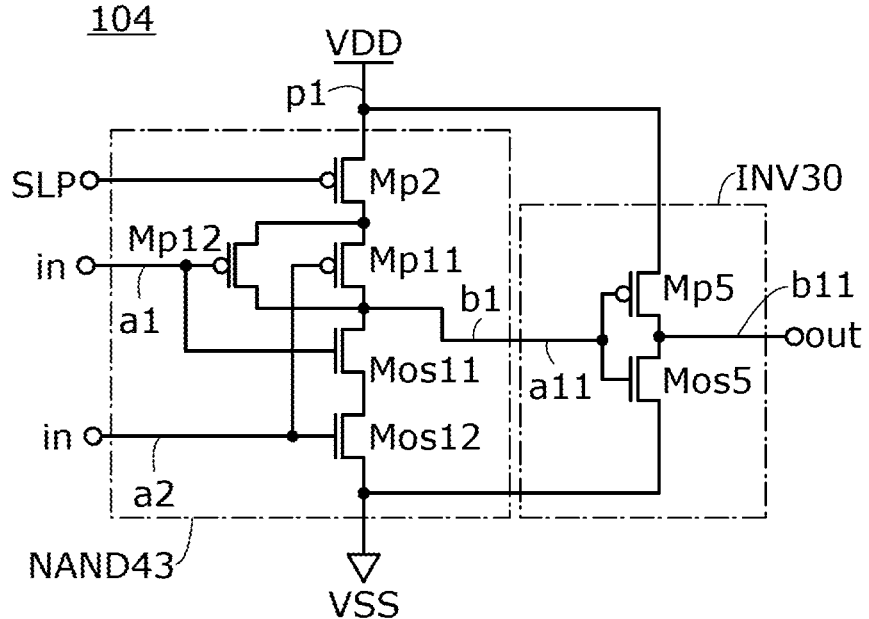

A semiconductor device 104 illustrated in FIG. 7B is a variation of the semiconductor device 103 and includes a NAND gate circuit and an inverter circuit as in the semiconductor device 103. The semiconductor device 104 includes the NAND 43 provided with the power switch for VDD and the INV 30 not including a power switch. Instead of the NAND 43, the NAND 41, the NAND 42, or the NAND 44 illustrated in FIG. 4A, 4B, or 4D may be provided.

By setting the standby mode when both the node a1 and the node a2 are at "H", the power gating function of the semiconductor device 104 can be effectively utilized. In the NAND 43, the supply of VDD to a source of the transistor Mp11 is blocked by the transistor Mp2, so that leakage currents of the transistors Mp11 and Mp12 can be reduced. Since the input node a11 is at "L", a leakage current of the INV 30 can be substantially zero. Furthermore, since the output node b1 can be maintained at "L", the output node b11 can also be maintained at "H". Thus, a shift from the standby mode to the normal operation mode can be performed in a short time.

Structural Example 1-5

Figure 8A:
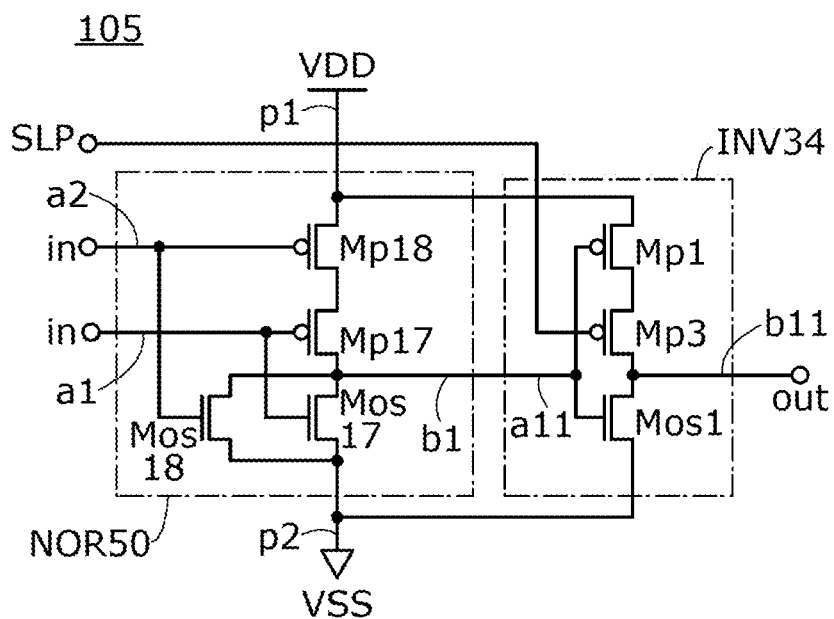
FIGS. 8A and 8B are circuit diagrams each illustrating a configuration example of a semiconductor device.

A semiconductor device 105 illustrated in FIG. 8A includes a NOR 50 and the NV 34 and functions as an OR gate circuit. The NOR 50 is a normal NOR gate circuit not having a function of blocking VDD or VSS. The NOR 50 includes two p-channel transistors (Mp17, Mp18) and two n-channel transistors (Mos17, Mos18). The transistors Mos17 and Mos18 are OS transistors. The input node a11 of the INV 34 is electrically connected to the output node b1 of the NOR 50. Instead of the INV34, the INV 31, the INV 32, or the INV33 illustrated in FIG. 3A, 3B, or 3C can be provided.

By setting the standby mode when the node a1 and the node a2 are at "L", the power gating function of the semiconductor device 105 can be effectively utilized. In the NOR 50, the transistors Mos17 and Mos18 are off, so that substantially no leakage current flows. In the INV 34, the input node a11 is at "H"; here, by setting the transistor Mp3 in an off state, a leakage current of the transistor Mp1 can be reduced. Accordingly, in the standby mode, the state of the output node b11 can be maintained at "L".

Structure Example 1-6

Figure 8B:
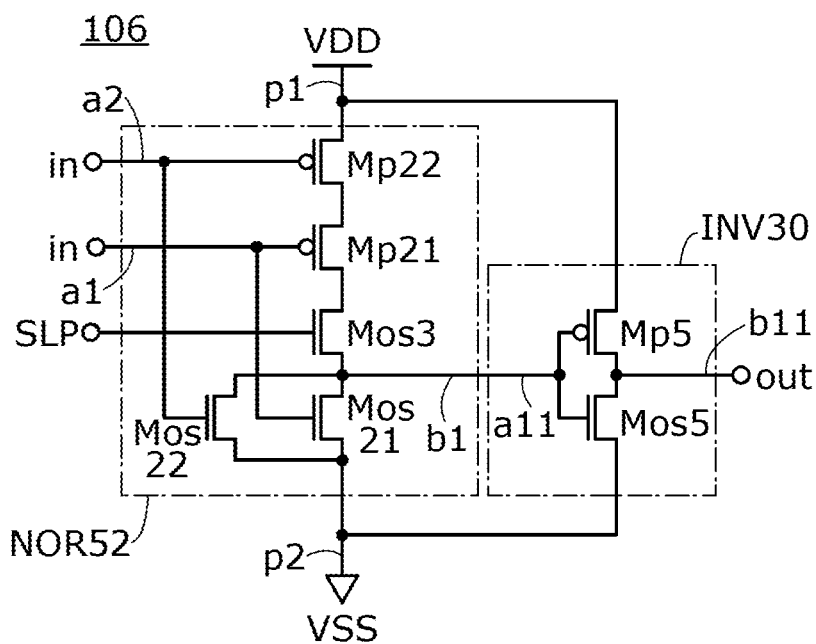

A semiconductor device 106 illustrated in FIG. 8B is a variation of the semiconductor device 105 and includes a NOR gate circuit and an inverter circuit as in the semiconductor device 105. In the semiconductor device 106, the NOR gate circuit is the NOR 52 provided with the power switch for VDD and the inverter circuit is the NV 30 not including a power switch. Instead of the NOR 52, the NOR 51, the NOR 53, or the NOR 54 illustrated in FIG. 5A, 5C, or 5D may be provided.

By setting the standby mode when the node a1 and the node a2 are at "H", the power gating function of the semiconductor device 106 can be effectively utilized. In the NOR 52, when the transistor Mos3 is brought into an off state, leakage currents of the transistors Mp21 and Mp22 can be reduced. In the INV 30, since the input node a11 is at "L", a leakage current can be suppressed to substantially zero. Furthermore, since the output node b1 can be maintained at "L", the output node b11 can also be maintained at "H".

Structure Example 1-7

Figure 9A:
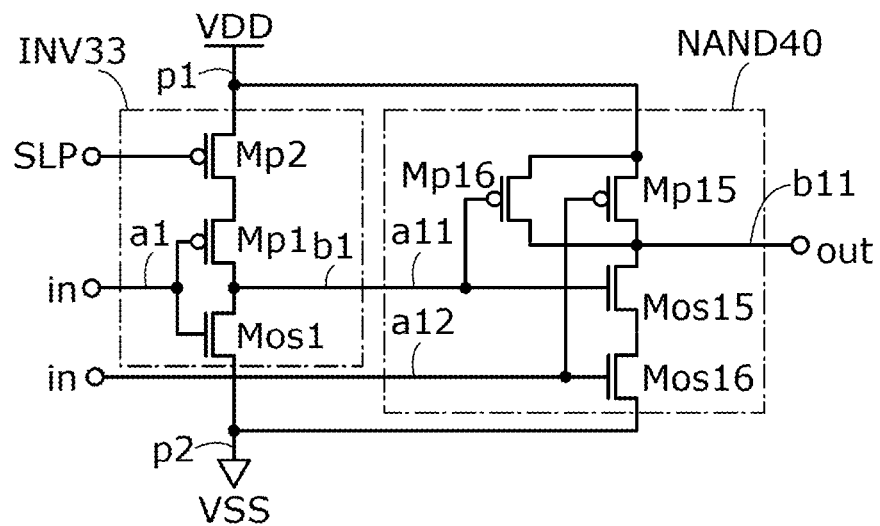
FIGS. 9A and 9B are circuit diagrams each illustrating a configuration example of a semiconductor device.

A semiconductor device 107 illustrated in FIG. 9A is a variation of the semiconductor device 103, where the INV 33 is provided on the input side and the NAND 40 is provided on the output side. Here, the output node b1 of the INV 33 and the input node a11 of the NAND 40 are electrically connected to each other. Instead of the INV 33, the INV 31, the INV 32, or the INV 34 can be provided.

By setting the standby mode when the node a1 is at "H" and the node a12 is at "L", the power gating function of the semiconductor device 107 can be effectively utilized. In the INV 33, when the transistor Mp2 is brought into an off state, a leakage current of the transistor Mp1 can be reduced. In the NAND 40, since the transistor Mos15 and the transistor Mos16 are off, a leakage current can be suppressed to substantially zero.

Structure Example 1-8

Figure 9B:
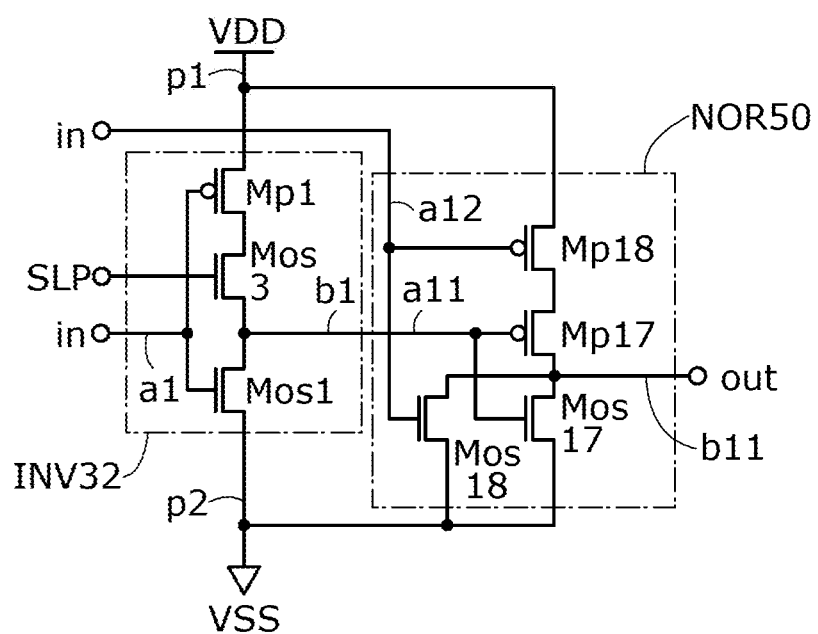

A semiconductor device 108 illustrated in FIG. 9B is a variation of the semiconductor device 105, where the INV 32 is provided on the input side and the NOR 50 is provided on the output side. Here, the output node b1 of the INV 32 and the input node a11 of the NOR 50 are electrically connected to each other. Instead of the NV 32, the INV 31, the INV 33, or the INV 34 can be provided.

By setting the standby mode when the node a1 is at "H" and the node a12 is at "L", the power gating function of the semiconductor device 108 can be effectively utilized. In the INV 32, the transistor Mos3 is brought into an off state, so that a leakage current of the transistor Mp1 can be reduced. In the NOR 50, since the transistor Mos17 and the transistor Mos18 are off, a leakage current can be suppressed to substantially zero.

Structure Example 2 of Semiconductor Device

Here, a clock tree will be described as an example of a semiconductor device.
<Structure Example of Clock Tree>

Figure 10A:
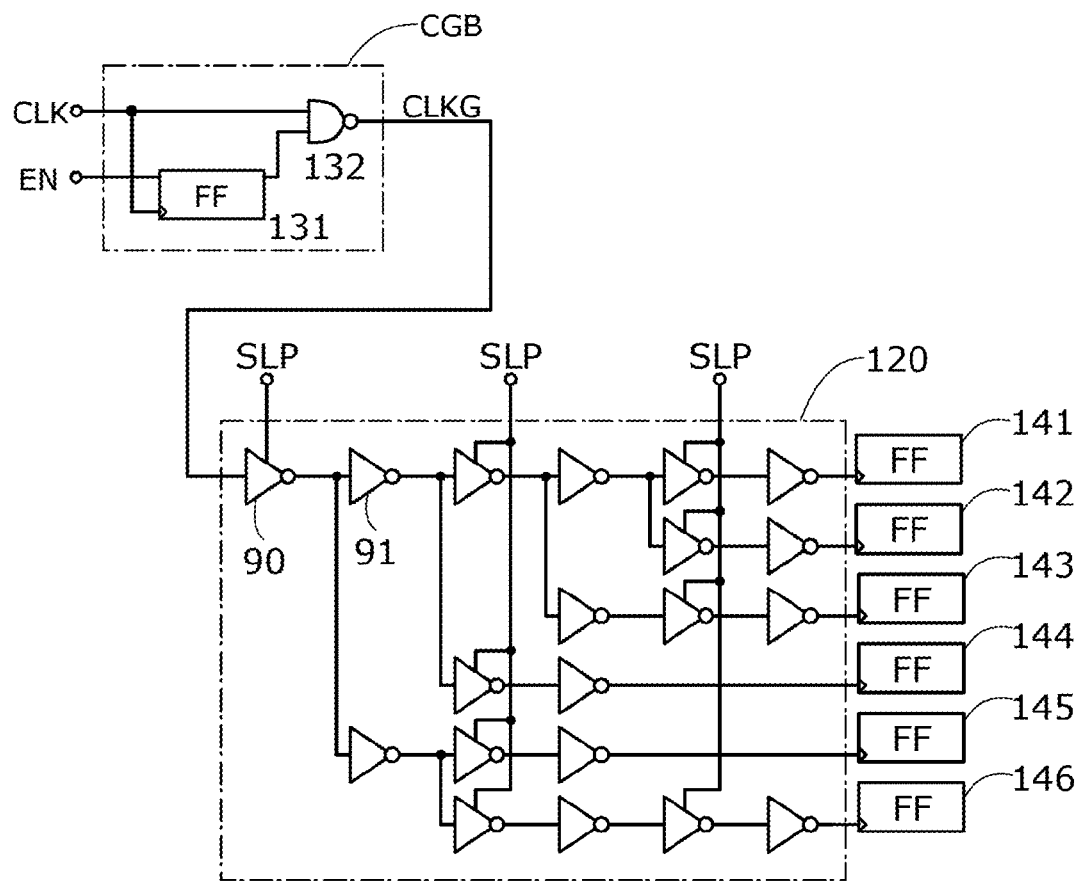
FIG. 10A illustrates a configuration example of a semiconductor device including a clock tree.

FIG. 10A illustrates an example of a semiconductor device including a clock tree. A clock tree 120 illustrated in FIG. 10A has a binary tree structure consisting of inverter circuits, with a depth (number of levels) of six and a number of outputs of six. To the first level of the clock tree 120, an output of a circuit CGB is connected. Flip-flop circuits (also referred to as FF in the following description) 141 to 146 are electrically connected to six output terminals (output nodes).

The circuit CGB can function as a clock gated circuit. The circuit CGB generates a gated clock signal CLKG that synchronizes with a clock signal CLK for a period when a signal EN is active. In the example of FIG. 10A, the circuit CGB includes an FF 131 and a NAND 132. The FF 131 functions as a memory circuit that holds the signal EN. The NAND 132 performs NAND operation of the signal EN and the signal CLK and generates and outputs the signal CLKG. In the example of FIG. 10A, the circuit CGB outputs the signal CLKG whose potential level changes in synchronization with the signal CLK to the clock tree 120 for a period when the output of the FF 131 is at "H". In the case where the signal EN is "L", the potential level of the signal CLKG is "H".

Figure 10B:
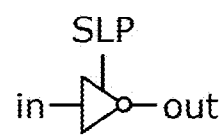
FIG. 10B illustrates a circuit symbol of an inverter circuit.

In the clock tree 120, the inverter circuits in the odd-numbered levels are INVs 90, and the inverter circuits in the even-numbered levels are INVs 91. Each of the INVs 90 can block the supply of VDD to the output node with the use of a power switch. The circuit symbol of such an inverter circuit is illustrated in FIG. 10B. The circuit symbol in FIG. 10B shows that the supply of VDD can be controlled with the signal SLP.

As the INVs 90, any of the INVs 31 to 34 illustrated in FIGS. 3A to 3D can be used. The INVs 91 are each a normal CMOS inverter circuit that is not provided with a power switch for blocking VDD or VSS, like the INV 30. In the case of using the INVs 31 or the INVs 33 as the INVs 90, the power switch for blocking VDD can be shared among a plurality of INVs 90. Such an example is illustrated in FIGS. 11A and 11B.

Figure 11A:
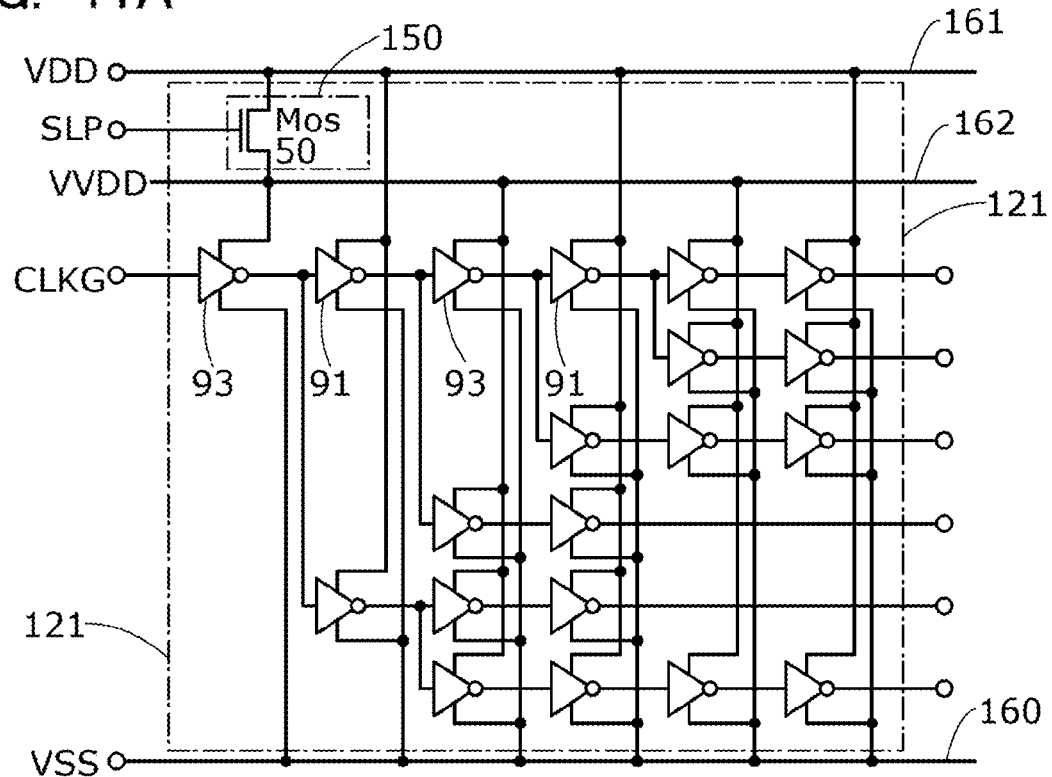
FIGS. 11A and 11B are circuit diagrams each illustrating a configuration example of a clock tree.

A clock tree 121 illustrated in FIG. 11A is provided with a power switch 150 shared among INVs 93 in the odd-numbered levels. Like the INVs 91, the INVs 93 are each a normal CMOS inverter circuit consisting of an n-channel transistor and a p-channel transistor. Here, an n-channel transistor Mos50 is used as the power switch 150. The transistor Mos50 is an OS transistor. The channel width of the transistor Mos50, the high-level potential of the signal SLP, and the like are determined by the number of INVs 93 controlled with the power switch 150 and the like.

In FIG. 11A, a wiring 160 functions as a power supply line that supplies a power supply potential VSS. A wiring 161 functions as a power supply line that supplies a power supply potential VDD. A wiring 162 functions as a virtual power supply line that supplies a virtual power supply potential VVDD. The power switch 150 has a function of controlling the conduction state between the wiring 161 and the wiring 162. Sources of the n-channel transistors in the INVs 91 and the INVs 93 are electrically connected to the wiring 160. Sources of the p-channel transistors in the INVs 91 are electrically connected to the wiring 161. Sources of the p-channel transistors in the INVs 93 are electrically connected to the wiring 162.

Figure 11B:
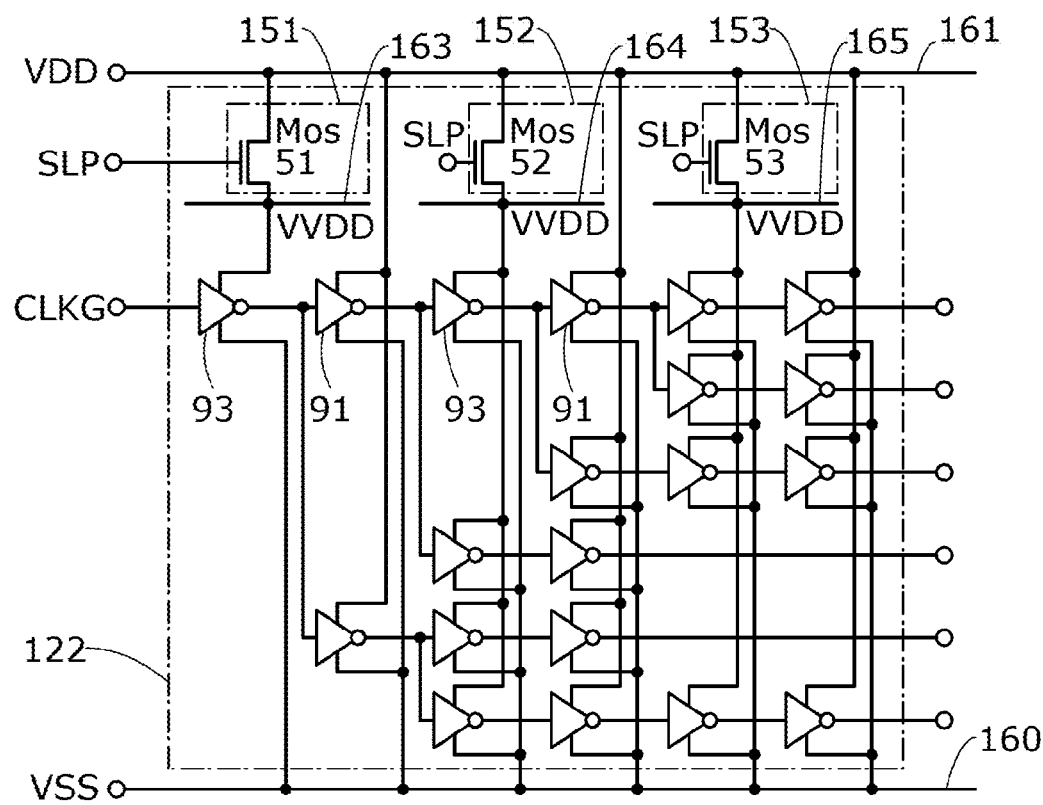

FIG. 11B illustrates an example where inverter circuits provided in the same level are controlled with the same power switch. A clock tree 122 illustrated in FIG. 11B is provided with a power switch 151, a power switch 152, and a power switch 153 in the first level, the third level, and the fifth level, respectively. The power switch 151, the power switch 152, and the power switch 153 are formed of a transistor Mos51, a transistor Mos52, and a transistor Mos53, respectively. The transistors Mos51, Mos52, and Mos53 are OS transistors. The power switches 151 to 153 are p-channel transistors. In FIG. 11B, a wiring 163, a wiring 164, and a wiring 165 each function as a virtual power supply line that supplies a virtual power supply potential VVDD.

The power switch 151 controls the conduction state between the wiring 161 and the wiring 163. The source of the p-channel transistor in the inverter circuit 93 in the first level is electrically connected to the wiring 163. The power switch 152 controls the conduction state between the wiring 161 and the wiring 164. The sources of the p-channel transistors in the inverter circuits 93 in the third level are electrically connected to the wiring 164. The power switch 153 controls the conduction state between the wiring 161 and the wiring 165. The sources of the p-channel transistors in the inverter circuits 93 in the fifth level are electrically connected to the wiring 165.

The signal SLP is input to gates of the transistors Mos51 to Mos53. The signal SLP may be input to the gates of the transistors Mos51 to Mos53 at the same time or at different times.

Furthermore, in the clock tree 120 illustrated in FIG. 10A, in the case where the INVs 90 are the INVs 32, the signal SLP may be input to all the INVs 32 provided in the clock tree 120 at the same time, or the signal SLP may be input to the INVs 32 at different levels (depths) of the clock tree 120 at different times. The same can apply to the case where the INVs 90 are the INVs 34.

Operation Example

An operation example of the semiconductor device illustrated in FIG. 10A will be described. Here, the clock tree 121 illustrated in FIG. 11A is used as the clock tree 120.

In the period when the signal EN is "H", the signal CLKG is supplied to the FFs 141 to 146. In this period, the signal SLP is "H", the transistor Mos50 is on, and VDD is supplied to the INVs 91 and the INVs 93.

To block the signal CLKG to the FFs 141 to 146, the signal EN is set to "L". Thus, the output of the circuit CGB is fixed at "H". Then, the outputs of the INVs 93 in the odd-numbered levels are fixed at "L", and the outputs of the INVs 91 in the even-numbered levels are fixed at "H". To bring the clock tree 121 into the standby mode, the signal EN is set to "L" and then the signal SLP is set to "L" to make the transistor Mos50 in an off state. In this way, the supply of VDD to the INVs 93 in the odd-numbered levels is blocked. Since the n-channel transistors of the INVs 93 are OS transistors, the leakage currents can be regarded as substantially zero, so that the outputs of the INVs 93 can be maintained at "L". Accordingly, the outputs of the INVs 91 in the even-numbered levels can be maintained at "H". Thus, in the standby mode, the six output nodes of the clock tree 121 can maintain the states immediately before the standby mode.

Therefore, when the clock tree 121 is returned to the normal operation, power for bringing the outputs of the INVs 91 in the even-numbered levels of the clock tree 121 to "H" is not necessary. Furthermore, overhead time required for the shift from the standby mode to the normal operation mode can be shortened. Moreover, the clock tree 121 can be returned to the normal operation mode by setting the signal SLP to "H" and the signal EN to "H".

Embodiment 2

In this embodiment, an OS transistor and a semiconductor device including an OS transistor will be described.

Structure Example 1 of OS Transistor

Figure 12A:
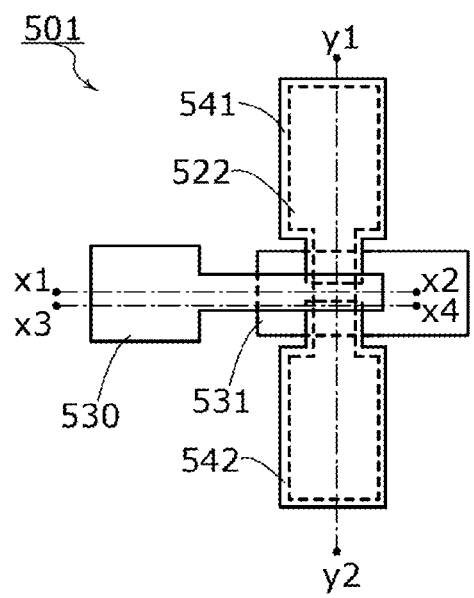
FIGS. 12A, 12B, 12C, and 12D are a plan view, a y1-y2 cross-sectional view, an x1-x2 cross-sectional view, and an x3-x4 cross-sectional view, respectively, illustrating a configuration example of an OS transistor.
Figure 12B:
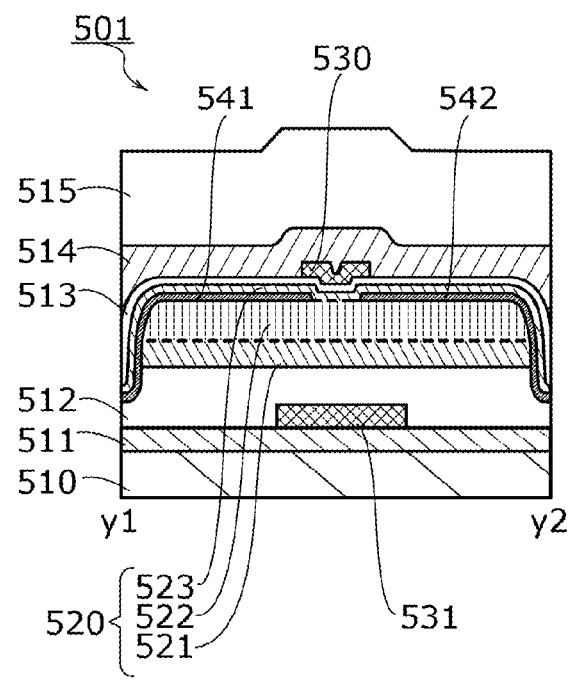
Figure 12C:
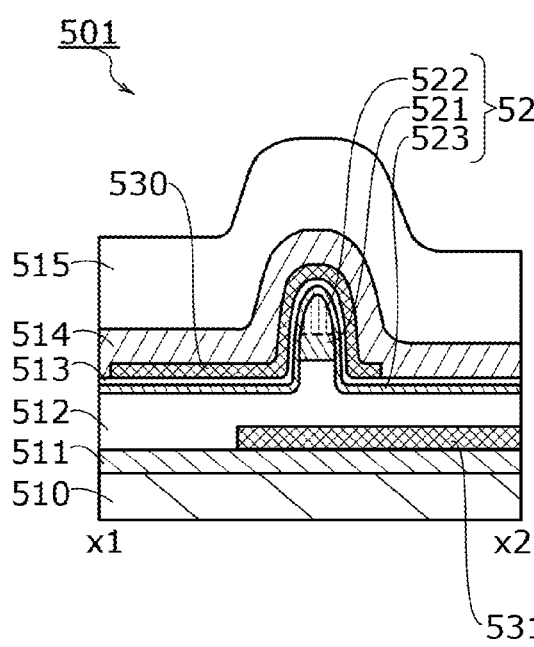
Figure 12D:
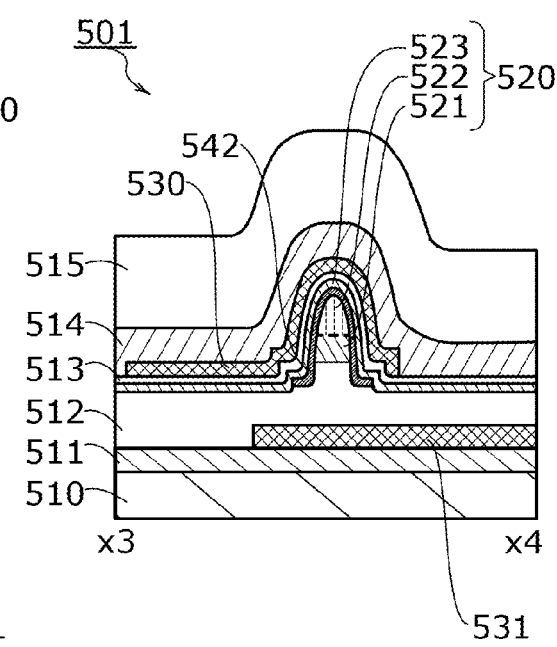

FIGS. 12A to 12D illustrate an example of a structure of an OS transistor. FIG. 12A is a plan view illustrating a structure example of an OS transistor. FIG. 12B is a cross-sectional view taken along a line y1-y2, FIG. 12C is a cross-sectional view taken along a line x1-x2, and FIG. 12D is a cross-sectional view taken along a line x3-x4. Here, in some cases, the direction of the line y1-y2 is referred to as a channel length direction, and the direction of the line x1-x2 is referred to as a channel width direction. Accordingly, FIG. 12B illustrates a cross-sectional structure of the OS transistor in the channel length direction, and FIGS. 12C and 12D each illustrate a cross-sectional structure of the OS transistor in the channel width direction. Note that to clarify the device structure, FIG. 12A does not illustrate some components.

An OS transistor 501 illustrated in FIGS. 12A to 12D includes a backgate. The OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor includes an insulating layer 512, an insulating layer 513, oxide semiconductor (OS) layers 521 to 523, a conductive layer 530, a conductive layer 531, a conductive layer 541, and a conductive layer 542. Here, the OS layers 521, 522, and 523 are collectively referred to as an OS layer 520.

The insulating layer 513 includes a region functioning as a gate insulating layer. The conductive layer 530 functions as a gate electrode. The conductive layer 531 functions as a backgate electrode. A constant potential, the same potential or signal supplied to the conductive layer 530, or a potential or signal that is different from that supplied to the conductive layer 530 may be supplied to the conductive layer 531. The conductive layer 541 and the conductive layer 542 function as a source electrode and a drain electrode.

As illustrated in FIGS. 12B and 12C, the OS layer 520 includes a region where the OS layer 521, the OS layer 522, and the OS layer 523 are stacked in this order. The insulating layer 513 covers this stacked region. The conductive layer 531 overlaps with the stacked region with the insulating layer 512 positioned therebetween. The conductive layer 541 and the conductive layer 542 are provided over the stacked film formed of the OS layer 521 and the OS layer 522 and are in contact with a top surface of this stacked film and a side surface positioned in the channel length direction of the stacked film. In the example of FIGS. 12A to 12D, the conductive layers 541 and 542 are also in contact with the insulating layer 512. The OS layer 523 is formed to cover the OS layers 521 and 522 and the conductive layers 541 and 542. A bottom surface of the OS layer 523 is in contact with a top surface of the OS layer 522.

The OS layer 523 and the insulating layer 513 may be etched using the conductive layer 530 as a mask. In this case, an edge of the OS layer 523 and an edge of the insulating layer 513 are substantially aligned with each other.

The conductive layer 530 is formed so as to surround, in the channel width direction, the region where the OS layers 521 to 523 are stacked in the OS layer 520 with the insulating layer 513 positioned therebetween (see FIG. 12C). Therefore, a gate electric field in the vertical direction and a gate electric field in the lateral direction are applied to this stacked region. In the OS transistor 501, "the gate electric field" refers to an electric field generated by voltage applied to the conductive layer 531 (gate electrode layer). Accordingly, the whole stacked region of the OS layers 521 to 523 can be electrically surrounded by the gate electric fields, so that a channel is formed in the whole OS layer 522 (bulk), in some cases. Thus, high on-state current characteristics of the OS transistor 501 can be achieved.

In this specification, a structure of a transistor in which a semiconductor is electrically surrounded by a gate electric field as in the above transistor is referred to as "a surrounded channel (s-channel) structure". The OS transistor 501 has the s-channel structure. With this s-channel structure, a large amount of current can flow between the source and the drain of the transistor, so that a high drain current in an on state can be achieved.

By employing the s-channel structure in the OS transistor 501, channel formation region controllability by a gate electric field applied to the side surface of the OS layer 522 becomes easy. In the structure where the conductive layer 530 reaches below the OS layer 522 and faces the side surface of the OS layer 521, higher controllability can be achieved, which is preferable. Consequently, the subthreshold swing (S value) of the OS transistor 501 can be made small, so that a short-channel effect can be reduced. Thus, the s-channel structure is appropriate for miniaturization.

When an OS transistor which has a three-dimensional structure as in the OS transistor 501 illustrated in FIGS. 12A to 12D, the channel length can be less than 100 nm. By the miniaturization, the circuit area of the OS transistor can be made small. The channel length of the OS transistor is preferably less than 65 nm, further preferably less than or equal to 30 nm or less than or equal to 20 nm.

A conductor functioning as a gate of a transistor, a conductor functioning as a source of a transistor, and a conductor functioning as a drain of a transistor are referred to as a gate electrode, a source electrode, and a drain electrode, respectively. A region functioning as a source of a transistor and a region functioning as a drain of a transistor are referred to as a source region and a drain region, respectively. In this specification, a gate electrode might be referred to as a gate, a drain electrode or a drain region might be referred to as a drain, and a source electrode or a source region might be referred to as a source.

The channel length refers to, for example, a distance between a source and a drain in a region where a semiconductor (or a portion where a current flows in a semiconductor when a transistor is on) and a gate overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate overlap with each other, or a region where a channel is formed. In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the plan view.

In this specification, in the case where the term "channel width" is simply used, it may denote an apparent channel width in some cases. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Structure Example 2 of OS Transistor

Figure 13A:
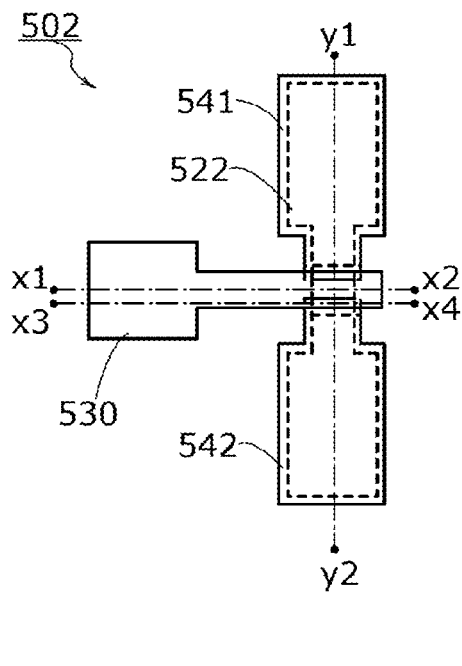
FIGS. 13A, 13B, 13C, and 13D are a plan view, a y1-y2 cross-sectional view, an x1-x2 cross-sectional view, and an x3-x4 cross-sectional view, respectively, illustrating a configuration example of an OS transistor.
Figure 13B:
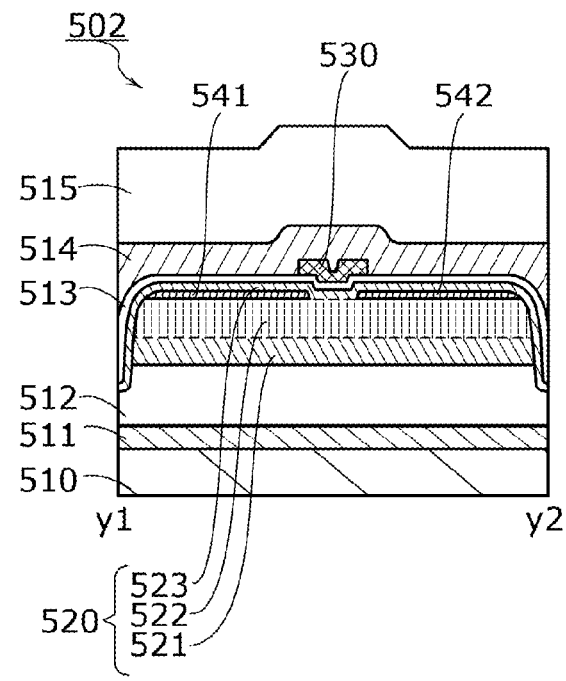
Figure 13C:
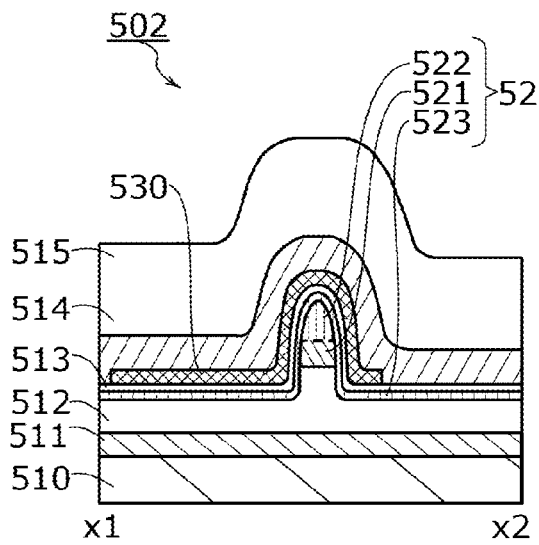
Figure 13D:
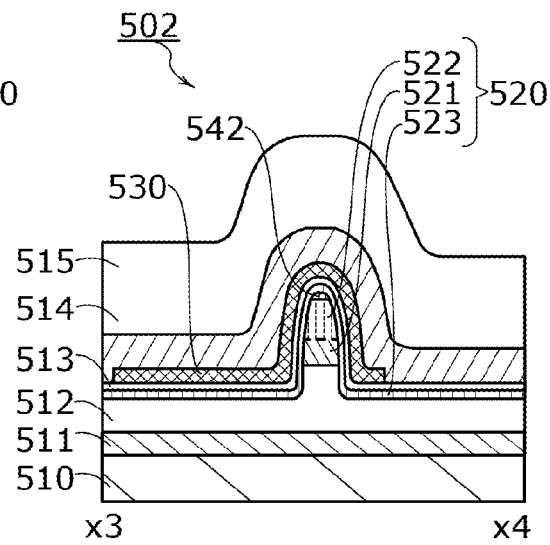

An OS transistor 502 illustrated in FIGS. 13A to 13D is a variation of the OS transistor 501. FIG. 13A is a plan view of the OS transistor 502. FIG. 13B is a cross-sectional view taken along a line y1-y2, FIG. 13C is a cross-sectional view taken along a line x1-x2, and FIG. 13D is a cross-sectional view taken along a line x3-x4. Note that to clarify the device structure, FIG. 13A does not illustrate some components.

Like the OS transistor 501, the OS transistor 502 illustrated in FIGS. 13A to 13D also has the s-channel structure. The OS transistor 502 does not include the conductive layer 531 and is different from the OS transistor 501 in the shapes of the conductive layer 541 and the conductive layer 542. The conductive layer 541 and the conductive layer 542 in the OS transistor 502 are formed from a hard mask used for forming the stacked film of the OS layer 521 and the OS layer 522. Therefore, the conductive layer 541 and the conductive layer 542 are not in contact with the side surfaces of the OS layer 521 and the OS layer 522 (FIG. 13D).

Through the following steps, the OS layers 521 and 522 and the conductive layers 541 and 542 can be formed. A two-layer oxide semiconductor film including the OS layers 521 and 522 is formed. A single-layer or multi-layer conductive film is formed over the oxide semiconductor film. This conductive film is etched, so that a hard mask is formed. Using this hard mask, the two-layer oxide semiconductor film is etched to form the OS layers 521 and 522. Then, the hard mask is etched to form the conductive layer 541 and the conductive layer 542.

The components of the OS transistors 501 and 502 will be described below.

<Oxide Semiconductor Layer>

As the semiconductor material of the OS layers 521 to 523, typically, an In—Ga oxide, an In—Zn oxide, or an In-M-Zn oxide (M is Ga, Y, Zr, La, Ce, or Nd) is used. In addition, the OS layers 521 to 523 are not limited to the oxide layers containing indium. The OS layers 521 to 523 can be a Zn—Sn oxide layer or a Ga—Sn oxide layer, for example. The OS layer 522 is preferably an In-M-Zn oxide layer.

A case where the OS layers 521 to 523 are In-M-Zn oxide layers formed by a sputtering method will be described. The atomic ratio of metal elements of a target for the deposition of an In-M-Zn oxide that is used for forming the OS layer 522 is as follows: In:M:Zn=$x_1$:$y_1$:$z_1$. The atomic ratio of metal elements of a target that is used for forming the OS layer 521 and the OS layer 523 is as follows: In:M:Zn=$x_2$:$y_2$:$z_2$.

For forming the OS layer 522, a polycrystalline target of an In-M-Zn oxide in which $x_1/y_1$ is greater than or equal to ⅓ and less than or equal to 6, or greater than or equal to 1 and less than or equal to 6, and $z_1/y_1$ is greater than or equal to ⅓ and less than or equal to 6, or greater than or equal to 1 and less than or equal to 6 is preferably used. Note that when $z_1/y_1$ is greater than or equal to 1 and less than or equal to 6, a CAAC-OS film is easily formed. Typical examples of the atomic ratio of the metal elements of the target are In:M:Zn=1:1:1, In:M:Zn=3:1:2, and the like. Note that the CAAC-OS is an oxide semiconductor including a c-axis aligned crystal part, and is described later.

In the target used for forming the OS layers 521 and 523, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film is easily formed. Typical examples of the atomic ratio of the metal elements of the target are In:M:Zn=1:3:2, In:M:Zn=1:3:4, In:M:Zn=1:3:6, In:M:Zn=1:3:8, and the like.

(Energy Band Structure)

Figure 14A:
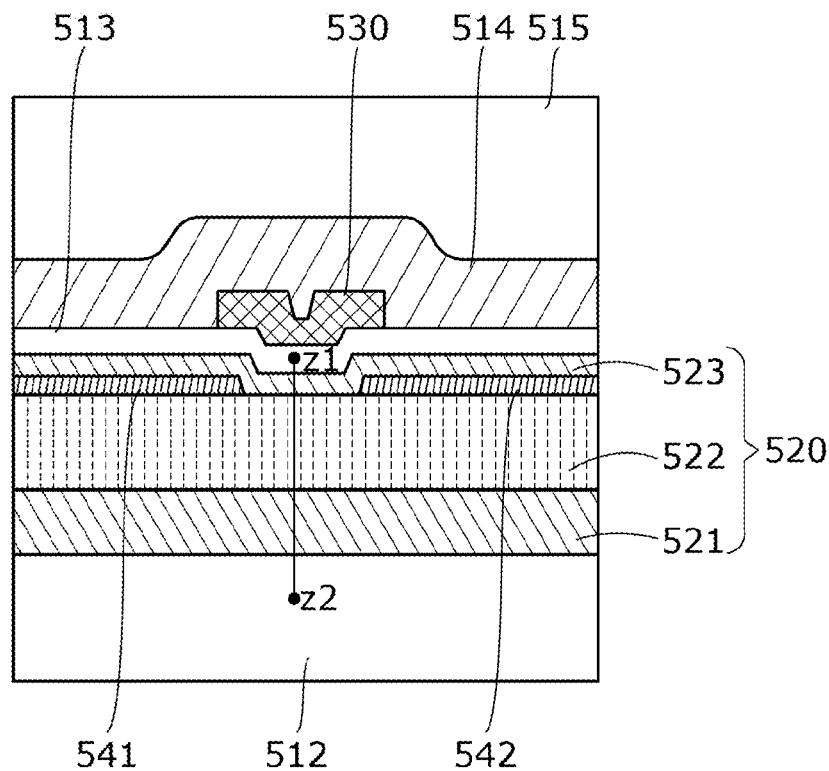
FIG. 14A is an enlarged view of a portion in FIG. 13B.
Figure 14B:
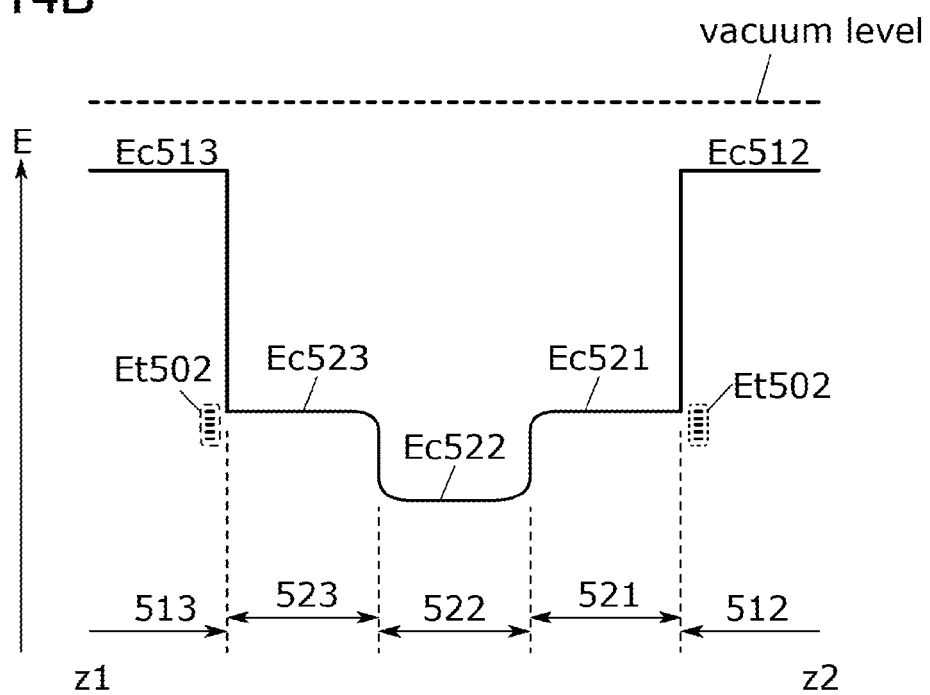
FIG. 14B is an energy band diagram of an OS transistor.

Next, a function and an effect of the OS layer 520 in which the OS layers 521, 522, and 523 are stacked are described using an energy band diagram in FIG. 14B. FIG. 14A is an enlarged view of a channel region of the OS transistor 502 illustrated in FIG. 13B. FIG. 14B shows an energy band diagram of a portion taken along a line z1-z2 (the channel formation region of the OS transistor 502) in FIG. 14A. The OS transistor 502 is described below as an example, but the same can apply to the OS transistor 501.

In FIG. 14B, Ec512, Ec521, Ec522, Ec523, and Ec513 indicate the energy at the bottom of the conduction band of the insulating layer 512, the OS layer 521, the OS layer 522, the OS layer 523, and the insulating layer 513, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the OS layers 521, 522, and 523).

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the OS layer 521 and the OS layer 522 and the interface between the OS layer 522 and the OS layer 523; thus, the energy at the bottom of the conduction band changes continuously. In other words, no state or few states exist at these interfaces.

Accordingly, electrons transfer mainly through the OS layer 522 in the stacked-layer structure having the above energy band structure. Therefore, even if an interface state exists at the interface between the OS layer 521 and the insulating layer 512 or the interface between the OS layer 523 and the insulating layer 513, the interface state hardly influences the transfer of electrons. In addition, since no interface state or few interface states exist at the interface between the OS layer 521 and the OS layer 522 and the interface between the OS layer 523 and the OS layer 522, the transfer of electrons is not interrupted in the region. Consequently, the transistor 502 including the above stacked oxide semiconductors can have high field-effect mobility.

Although trap states Et502 due to impurities or defects might be formed in the vicinity of the interface between the OS layer 521 and the insulating layer 512 and the interface between the OS layer 523 and the insulating layer 513 as illustrated in FIG. 14B, the OS layer 522 can be separated from the trap states owing to the existence of the OS layers 521 and 523.

In the transistor 502, in the channel width direction, the top surface and side surfaces of the OS layer 522 are in contact with the OS layer 523, and the bottom surface of the OS layer 522 is in contact with the OS layer 521 (see FIG. 13C). Surrounding the OS layer 522 by the OS layers 521 and 523 in this manner can further reduce the influence of the trap states.

However, when the energy difference between Ec522 and Ec521 or Ec523 is small, an electron in the OS layer 522 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy gaps between Ec521 and Ec522 and between Ec522 and Ec523 is preferably 0.1 eV or more, or further preferably 0.15 eV or more, in which case a change in the threshold voltage of the transistor can be reduced and the transistor can have favorable electrical characteristics.

The band gap of each of the OS layers 521 and 523 is preferably wider than that of the OS layer 522.

For the OS layers 521 and 523, a material containing Y, Zr, La, Ce, or Nd with a higher atomic ratio than that used for the OS layer 522 can be used, for example. Specifically, any of the above metal elements with an atomic ratio 1.5 times or more, preferably 2 times or more, or further preferably 3 times or more as high as the metal element in the OS layer 522 is contained. Any of the above metal elements is strongly bonded to oxygen and thus has a function of suppressing generation of an oxygen vacancy in the oxide semiconductor. That is, an oxygen vacancy is less likely to be generated in the OS layers 521 and the 523 than in the OS layer 522.

When the OS layers 521, 522, and 523 are In-M-Zn oxides containing at least indium, zinc, and M (M is Ga, Y, Zr, La, Ce, or Nd) and the atomic ratio of In to M and Zn of the OS layer 521 is $x_1:y_1:z_1$, that of the OS layer 522 is $x_2:y_2:z_2$, and that of the OS layer 523 is $x_3:y_3:z_3$, $y_1/x_1$ and $y_3/x_3$ are preferably larger than $y_2/x_2$. Furthermore, $y_1/x_1$ and $y_3/x_3$ are 1.5 times or more as large as $y_2/x_2$, preferably 2 times or more as large as $y_2/x_2$, or further preferably 3 times or more as large as $y_2/x_2$. In this case, the transistor can have stable electrical characteristics when $y_2$ is greater than or equal to $x_2$ in the OS layer 522. However, when $y_2$ is three times or more as large as $x_2$, the field-effect mobility of the transistor is reduced; accordingly, $y_2$ is preferably smaller than 3 times $X_2$.

An In-M-Zn oxide film satisfying the above conditions can be formed using an In-M-Zn oxide target satisfying the above atomic ratio of metal elements.

In the case where Zn and O are not taken into consideration, the proportion of In and the proportion of M in the OS layer 521 and the OS layer 523 are preferably less than 50 atomic % and greater than 50 atomic %, respectively, or further preferably less than 25 atomic % and greater than 75 atomic %, respectively. In the case where Zn and O are not taken into consideration, the proportion of In and the proportion of M in the OS layer 522 are preferably greater than 25 atomic % and less than 75 atomic %, respectively, or further preferably greater than 34 atomic % and less than 66 atomic %, respectively.

The thickness of each of the OS layers 521 and 523 is greater than or equal to 3 nm and less than or equal to 100 nm, or preferably greater than or equal to 3 nm and less than or equal to 50 nm. The thickness of the OS layer 522 is greater than or equal to 3 nm and less than or equal to 200 nm, preferably greater than or equal to 3 nm and less than or equal to 100 nm, or further preferably greater than or equal to 3 nm and less than or equal to 50 nm. The OS layer 523 is preferably thinner than the OS layers 521 and 522.

Note that in order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to the state where an oxide semiconductor has a carrier density lower than $1 \times 10^{17}/cm^3$, preferably lower than $1 \times 10^{15}/cm^3$, or further preferably lower than $1 \times 10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity level becomes a trap, which might deteriorate the electrical characteristics of the transistor. Therefore, it is preferable to reduce the concentration of the impurities in the OS layers 521, 522, and 523 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by in secondary ion mass spectrometry (SIMS), is lower than $1 \times 10^{19}$ atoms/cm$^3$, preferably lower than $5 \times 10^{18}$ atoms/cm$^3$, or further preferably lower than $1 \times 10^{18}$ atoms/cm$^3$. The concentration of hydrogen at a certain depth of the oxide semiconductor or in a certain region of the oxide semiconductor is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, or still further preferably lower than or equal to $5 \times 10^{18}$ atoms/cm$^3$. The concentration of nitrogen at a certain depth of the oxide semiconductor or in a certain region of the oxide semiconductor is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, or still further preferably lower than or equal to $5 \times 10^{17}$ atoms/cm$^3$.

In addition, in the case where the oxide semiconductor includes a crystal, the crystallinity of the oxide semiconductor might be decreased if silicon or carbon is included at high concentration. In order not to lower the crystallinity of the oxide semiconductor, for example, the concentration of silicon at a certain depth of the oxide semiconductor or in a certain region of the oxide semiconductor is lower than $1 \times 10^{19}$ atoms/cm$^3$, preferably lower than $5 \times 10^{18}$ atoms/cm$^3$, or further preferably lower than $1 \times 10^{18}$ atoms/cm$^3$. Furthermore, the concentration of carbon at a certain depth of the oxide semiconductor or in a certain region of the oxide semiconductor is lower than $1 \times 10^{19}$ atoms/cm$^3$, preferably lower than $5 \times 10^{18}$ atoms/cm$^3$, or further preferably lower than $1 \times 10^{18}$ atoms/cm$^3$, for example.

A transistor in which a highly purified oxide semiconductor is used for a channel formation region as described above has an extremely low off-state current. In the case where the voltage between a source and a drain is set at approximately 0.1 V, 5 V, or 10 V, for example, the off-state current standardized on the channel width of the transistor can be as low as several yoctoamperes per micrometer to several zeptoamperes per micrometer.

<Crystal Structure of Oxide Semiconductor>

A structure of an oxide semiconductor film that forms the OS layer 520 will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Oxide semiconductors are classified roughly into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. In addition, examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

(CAAC-OS)

A CAAC-OS is one of oxide semiconductors having a plurality of c-axis aligned crystal parts (also referred to as pellets). The crystal parts of the CAAC-OS can also be referred to as a nanocrystal (nc). A CAAC-OS can be referred to as an oxide semiconductor including c-axis aligned nanocrystals (CANC).

In a combined analysis image (also referred to as a high-resolution TEM image) of a bright-field image and a diffraction pattern of a CAAC-OS, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS, a reduction in electron mobility due to the grain boundary is less likely to occur.

In the high-resolution cross-sectional TEM image of the CAAC-OS observed in a direction substantially parallel to the sample surface, metal atoms arranged in a layered manner are seen in the crystal parts. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

While in the high-resolution planar TEM image of the CAAC-OS observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS analyzed by X-ray diffraction (XRD) will be described. When a CAAC-OS including an $InGaZnO_4$ crystal is subjected to structural analysis by an out-of-plane method, a peak appears frequently when the diffraction angle ($2\theta$) is around $31°$. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around $36°$, in addition to the peak at $2\theta$ of around $31°$. The peak of $2\theta$ at around $36°$ indicates that a crystal having no c-axis alignment is included in part of the CAAC-OS. It is preferable that in the CAAC-OS, a peak of $2\theta$ appear at around $31°$ and a peak of $2\theta$ not appear at around $36°$.

The CAAC-OS is an oxide semiconductor with a low impurity concentration. The impurity is an element other than the main components of the oxide semiconductor, such as hydrogen, carbon, silicon, or a transition metal element. An element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity. Additionally, the impurity contained in the oxide semiconductor might serve as a carrier trap or a carrier generation source.

On the other hand, in structural analysis of the CAAC-OS by an in-plane method in which an X-ray is incident on a sample in a direction substantially perpendicular to the c-axis, a peak appears when $2\theta$ is around $56°$. This peak is attributed to the (110) plane of the $InGaZnO_4$ crystal. In the case of the CAAC-OS, when analysis ($\phi$ scan) is performed with $2\theta$ fixed at around $56°$ and with the sample rotated using a normal vector of the sample surface as an axis ($\phi$ axis), a peak is not clearly observed. In contrast, in the case of a single crystal oxide semiconductor of $InGaZnO_4$, when $\phi$ scan is performed with $2\theta$ fixed at around $56°$, six peaks which are derived from crystal planes equivalent to the (110) plane are observed. Accordingly, the structural analysis using XRD shows that the directions of a-axes and b-axes are irregularly oriented in the CAAC-OS.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

Thus, the CAAC-OS is an oxide semiconductor having a low density of defect states. For example, oxygen vacancies in the oxide semiconductor serve as carrier traps or serve as carrier generation sources when hydrogen is captured therein.

A highly purified intrinsic or substantially highly purified intrinsic oxide semiconductor has few carrier generation sources, and thus has a low carrier density in some cases. Thus, a transistor including the oxide semiconductor rarely has a negative threshold voltage (is rarely normally on). The highly purified intrinsic or substantially highly purified intrinsic oxide semiconductor has few carrier traps. Accordingly, the transistor including the oxide semiconductor has little variation in electrical characteristics and high reliability. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics.

In an OS transistor using the CAAC-OS, change in electric characteristics of the transistor due to irradiation with visible light or ultraviolet light is small.

(Nc-OS, Microcrystalline Oxide Semiconductor)

A microcrystalline oxide semiconductor has a region in which a crystal part is observed and a region in which a crystal part is not observed clearly in a high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor including nanocrystal is referred to as an nc-OS (nanocrystalline oxide semiconductor). In a high-resolution TEM image of the nc-OS, for example, a grain boundary is not clearly observed in some cases.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Accordingly, in some cases, the nc-OS cannot be distinguished from an amorphous oxide semiconductor depending on an analysis method. For example, when the nc-OS is analyzed by an out-of-plane method using an X-ray beam having a diameter larger than the size of a crystal part, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS when an electron beam having a probe diameter close to or smaller than the size of a crystal part is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different crystal parts in the nc-OS. Therefore, the nc-OS has a higher density of defect states than the CAAC-OS.
(a-Like OS, Amorphous Oxide Semiconductor Film)

The amorphous oxide semiconductor is an oxide semiconductor having disordered atomic arrangement and no crystal part. For example, the amorphous oxide semiconductor does not have a specific state as in quartz.

In a high-resolution TEM image of the amorphous oxide semiconductor, crystal parts cannot be found. When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

An a-like OS has a structure intermediate between those of the nc-OS and the amorphous oxide semiconductor. In a high-resolution TEM image of the a-like OS, a void may be observed. Furthermore, in the high-resolution TEM image, there are a region where a crystal part is clearly observed and a region where a crystal part is not observed. In this manner, growth of the crystal part occurs due to the crystallization of the a-like OS, which is induced by a slight amount of electron beam employed in the TEM observation. In contrast, crystallization by a slight amount of electron beam used for TEM observation is less observed in the nc-OS having good quality.

Note that the crystal part size in the a-like OS and the nc-OS can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

The density of an oxide semiconductor varies depending on the structure in some cases. For example, if the composition of an oxide semiconductor is determined, the structure of the oxide semiconductor can be estimated from a comparison between the density of the oxide semiconductor and the density of a single crystal oxide semiconductor having the same composition as the oxide semiconductor. For example, the density of an a-like OS is higher than or equal to 78.6% and lower than 92.3% of that of the single crystal oxide semiconductor. In addition, for example, the density of an nc-OS or a CAAC-OS is higher than or equal to 92.3% and lower than 100% of that of the single crystal oxide semiconductor. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

However, there might be no single crystal oxide semiconductor having the same composition as the oxide semiconductor. In that case, single crystal oxide semiconductors with different compositions are combined in an adequate ratio to calculate the density equivalent to that of a single crystal oxide semiconductor with the desired composition. The density of the single crystal oxide semiconductor having the desired composition can be calculated using a weighted average according to the combination ratio of the single crystal oxide semiconductors with different compositions. Note that it is preferable to combine as few kinds of single crystal oxide semiconductors as possible for density calculation.

Note that an oxide semiconductor may be a stacked film including two or more of an amorphous oxide semiconductor, an a-like OS, an nc-OS, a microcrystalline oxide semiconductor, and a CAAC-OS, for example.
<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the OS layer 520. For this reason, the insulating layer 512 is preferably an insulating film containing oxygen, further preferably, an insulating film containing oxygen in which the oxygen content is higher than that in the stoichiometric composition. For example, a film from which oxygen molecules at more than or equal to $1.0\times10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) treatment so as to have a flat surface.

The insulating layers 511 and 512 can be formed using an insulating material of aluminum oxide, aluminum oxynitride, magnesium oxide, silicon oxide, silicon oxynitride, gallium oxide, germanium oxide, yttrium oxide, zirconium oxide, lanthanum oxide, neodymium oxide, hafnium oxide, tantalum oxide, silicon nitride, silicon nitride oxide, aluminum nitride oxide, or the like, or a mixed material of these materials. In this specification, oxynitride refers to a material which includes more oxygen than nitrogen, and nitride oxide refers to a substance which includes more nitrogen than oxygen.

<Gate Electrode>

The conductive layer 530 is preferably formed using a single low-resistant material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy of any of these materials; or a compound containing any of these materials as its main component. The conductive layer 530 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

<Gate Insulating Layer>

The insulating layer 513 is formed using an insulating film having a single-layer structure or a stacked-layer structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably includes hafnium oxide, and silicon oxide or silicon oxynitride.

Hafnium oxide has a higher dielectric constant than silicon oxide and silicon oxynitride. Therefore, the thickness can be made large as compared with silicon oxide; thus, leakage current due to tunnel current can be low. That is, a transistor with a low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with a low off-state current. Examples of the crystal structure include a monoclinic crystal structure and a cubic crystal structure. Note that one embodiment of the present invention is not limited to the above examples.

<Source Electrode, Drain Electrode, Backgate Electrode>

The conductive layers 541 and 542 and the conductive layer 531 can be formed in a manner similar to that of the conductive layer 530. A Cu—Mn alloy film is preferably used for the conductive layers 541 and 542 because of its low electrical resistance and because it forms manganese oxide at the interface with the OS layer 520 and manganese oxide can prevent Cu diffusion.

<Protective Insulating Film>

The insulating layer 514 preferably has a function of blocking oxygen, hydrogen, water, an alkali metal, an alkaline earth metal, and the like. The provision of the insulating layer 514 can prevent outward diffusion of oxygen from the OS layer 520 and entry of hydrogen, water, or the like into the OS layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 520, preventing release of oxygen, which is the main component of the OS layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a layered structure. The insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<<Film Formation Method>>

A sputtering method and a plasma-enhanced chemical vapor deposition method are typical examples of a method of forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as a thermal CVD method, for example.

A thermal CVD method does not generate plasma and thus has an advantage that no defect due to plasma damage is caused. Deposition by a thermal CVD method may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, an ALD method makes it possible to accurately adjust thickness and thus is suitable for manufacturing a minute FET.

The conductive film and the semiconductor film that are described in the above embodiment can be formed by a thermal CVD method such as a MOCVD method or an ALD method. For example, in the case where an $InGaZnO_X$ (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced at the same time, so that a tungsten film is formed. Note that an $SiH_4$ gas may be used instead of a $B_2H_6$ gas.

For example, in the case where an oxide semiconductor film, for example, an $InGaZnO_X$ (X>0) film is formed using a deposition apparatus employing ALD, an $In(CH_3)_3$ gas and an $O_3$ gas are sequentially introduced more than once to form an $InO_2$ layer, a $Ga(CH_3)_3$ gas and an $O_3$ gas are introduced at the same time to form a GaO layer, and then a $Zn(CH_3)_2$ gas and an $O_3$ gas are introduced at the same time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Note that although an $H_2O$ gas that is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<<Structure Example of Semiconductor Device>>

A device structure of a semiconductor device including an OS transistor will be described below. As described in Embodiment 1, the p-channel transistor and the n-channel transistor included in the semiconductor device can be a Si transistor and an OS transistor, respectively. The semiconductor device with such a structure can be reduced in size by stacking an OS transistor over a p-channel transistor. A structure example of a semiconductor device with such a stacked structure is described with reference to FIGS. 15A to 15C and FIG. 16. Here, a device structure of the semiconductor device 102 illustrated in FIG. 6B, which is an example of the semiconductor device, will be described.

Figure 15A:
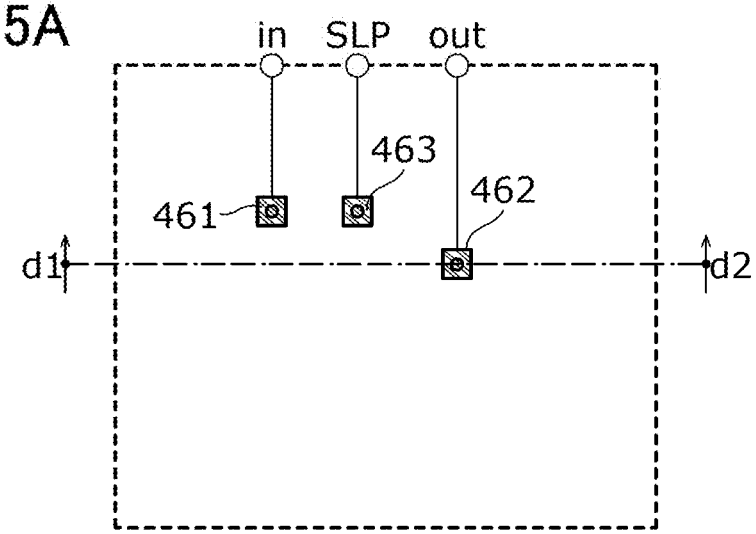
FIGS. 15A to 15C are plan views illustrating a layout example of a semiconductor device.
Figure 15B:
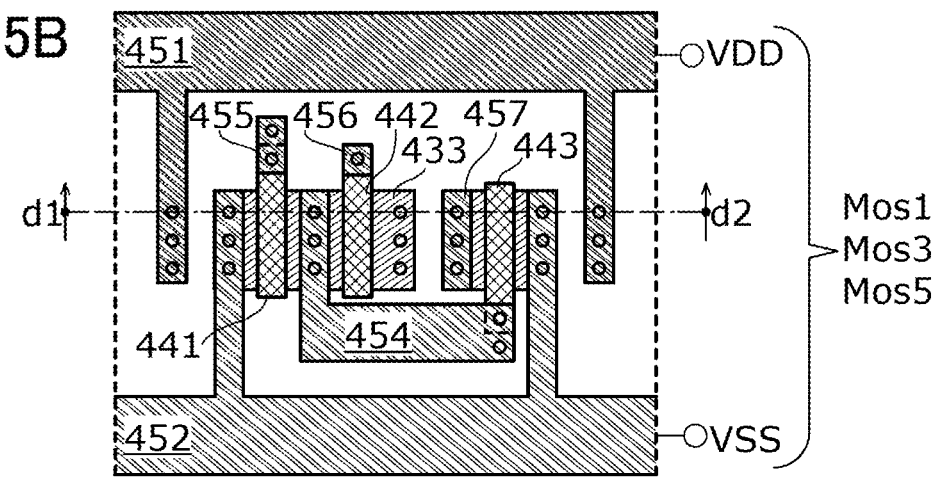
Figure 15C:
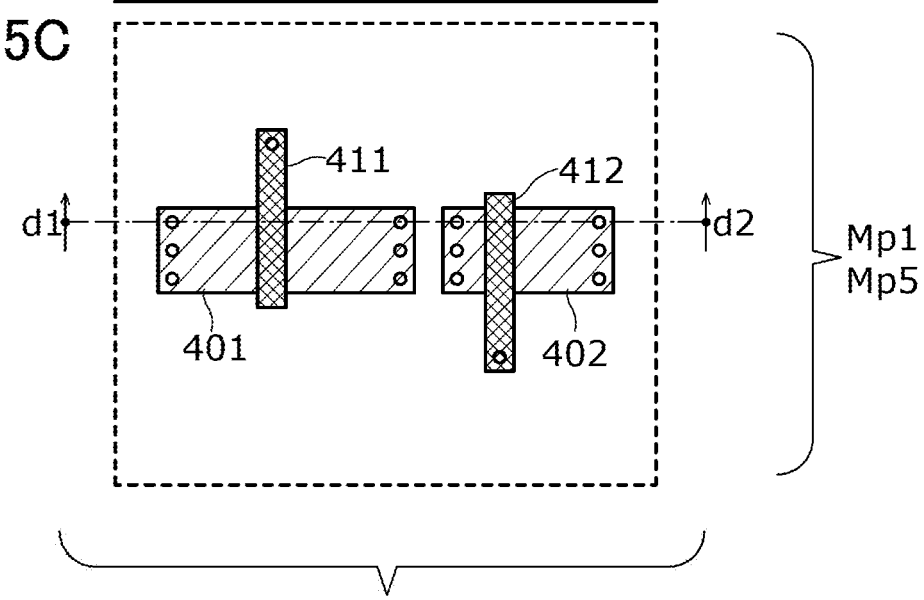
Figure 16:
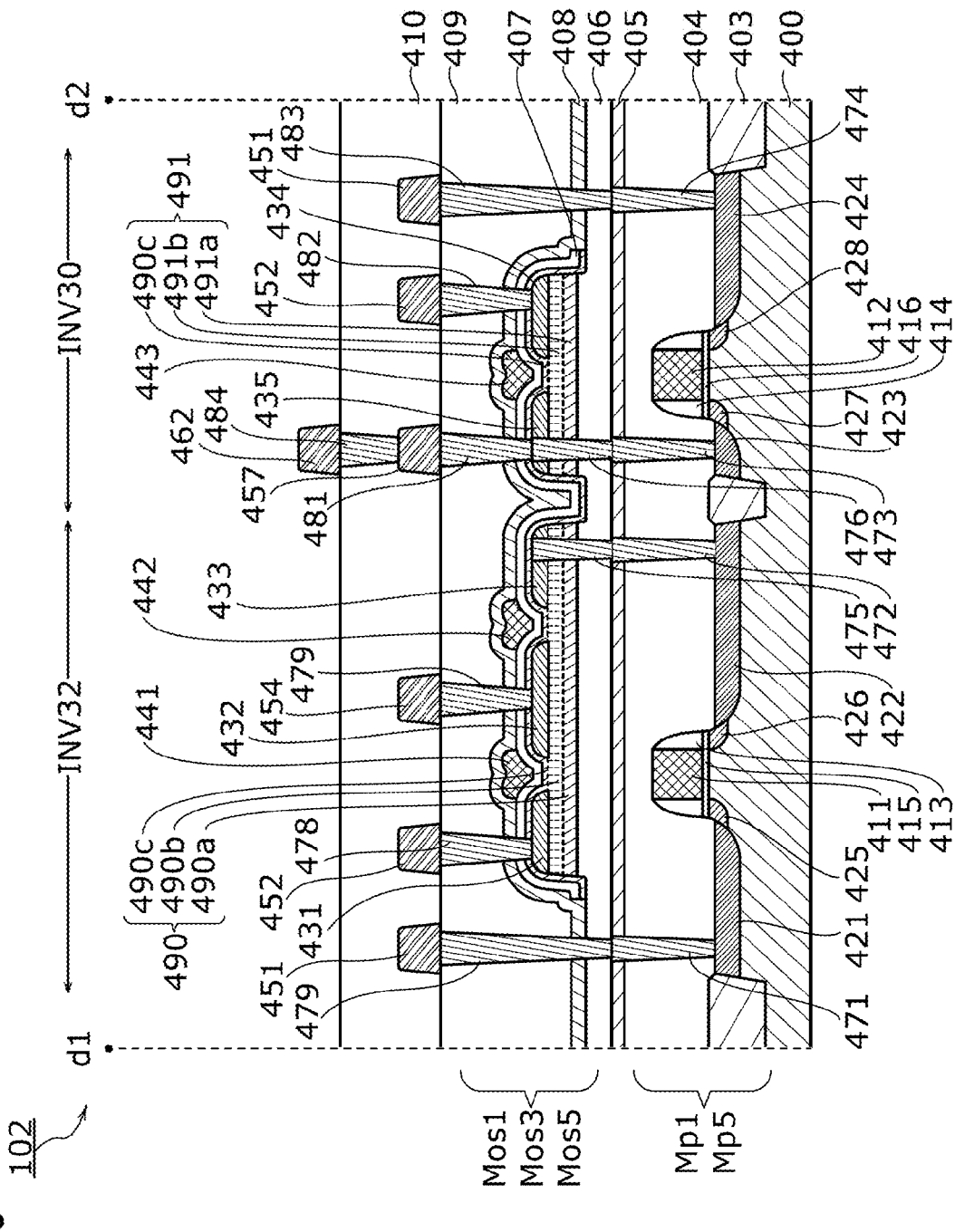
FIG. 16 is a cross-sectional view taken along a line d1-d2 of FIGS. 15A to 15C.

FIGS. 15A to 15C are plan views illustrating an example of the device structure of the semiconductor device 102, and FIG. 16 is a cross-sectional view thereof. The circuit layout of the semiconductor device 102 is divided into three plan views for clarity, which are illustrated in FIGS. 15A to 15C where some components (e.g., an insulating layer or a plug) are omitted. FIG. 15C is a plan view illustrating the transistors Mp1 and Mp5, FIG. 15B is a plan view illustrating the transistors Mos1, Mos3, and Mos5 and a wiring through which a power supply potential is supplied, and FIG. 15A is a plan view illustrating signal input terminals and an output terminal. FIG. 16 is a cross-sectional view taken along a line d1-d2 of FIGS. 15A to 15C and corresponds to a cross-sectional view in the channel length direction of the transistors included in the semiconductor device 102.

In the example of FIG. 16, the semiconductor device 102 is formed in and over a single crystal silicon wafer 400. An insulating layer 403 is a layer for element-isolating the transistor Mp1 from the transistor Mp5. A region 401 is an element region where the transistor Mp1 is formed, and a region 402 is an element region where the transistor Mp5 is formed. The transistors Mos1, Mos3, and Mos5 have device structures similar to that of the OS transistor 502 illustrated in FIGS. 13A to 13D and can be formed similarly.

In FIG. 16, insulating layers 404 to 410 are each a single-layer or multi-layer insulating film. This insulating film can be formed using an insulator containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating film can be formed using an organic resin film of a polyimide resin, a polyamide resin, an acrylic resin, a siloxane resin, an epoxy resin, a phenol resin, or the like.

<Transistors Mp1, Mp5>

The semiconductor device 102 is formed in and over the single crystal silicon wafer 400. The insulating layer 403 is a layer for element-isolating the transistor Mp1 from the transistor Mp5. The region 401 is an element region where the transistor Mp1 is formed, and the region 402 is an element region where the transistor Mp5 is formed. In the example of FIG. 16, the transistors Mp1 and Mp5 are planar field-effect transistors. Needless to say, the device structures of the transistors Mp1 and Mp5 are not limited to those in the example of FIG. 16. For example, a 3D transistor (e.g., a fin-type transistor or a Tri-gate type transistor) can be employed. Furthermore, the transistors Mp1 and Mp5 may be formed from an SOI semiconductor substrate including a single crystal silicon layer.

The transistor Mp1 includes a conductive layer 411, a gate insulating layer 415, an impurity region 421, an impurity region 422, an impurity region 425, and an impurity region 426. These impurity regions are formed in the element region 401. The element region 401 includes a channel region of the transistor Mp1. The impurity regions 421 and 422 function as a source region and a drain region. The impurity regions 425 and 426 function as lightly doped drain (LDD) regions or extension regions. Here, the impurity regions 421, 422, 425, and 426 have p-type conductivity. The conductive layer 411 functions as a gate electrode of the transistor Mp1. An insulating layer 413 is formed on a side surface of the conductive layer 411. Owing to the insulating layer 413, the impurity regions 421, 422, 425, and 426 can be formed in the element region 401 in a self-aligned manner.

The transistor Mp5 includes a conductive layer 412, a conductive layer 414, a gate insulating layer 416, an impurity region 423, an impurity region 424, an impurity region 427, and an impurity region 428. These impurity regions are formed in the element region 402 and have p-type conductivity. The element region 402 includes a channel region of the transistor Mp5. The transistor Mp5 has a device structure similar to that of the transistor Mp1.

The transistors Mp1 and Mp5 are covered with the insulating layer 404. The insulating layer 405 is formed over the insulating layer 404, and the transistors Mos1, Mos3, and Mos5 are formed over the insulating layer 406.

Hydrogen in the insulating layer 404 provided in the vicinity of the semiconductor films of the transistors Mp1 and Mp5 terminates dangling bonds of silicon and improves the reliability of the transistors Mp1 and Mp5. This hydrogen, however, is a factor of generating carriers in the oxide semiconductor films of the transistors Mos1, Mos3, and Mos5 and might lower the reliability of the transistors Mos1, Mos3, and Mos5. Thus, it is preferable that the insulating layer 405 positioned between the transistors Mp1 and Mp5 and the transistors Mos1, Mos3, and Mos5 have a function of preventing diffusion of hydrogen. The insulating layer 405 prevents diffusion of hydrogen from the lower layer to the upper layer, so that the reliability of the transistors Mp1 and Mp5 and the transistors Mos1, Mos3, and Mos5 can be improved.

The insulating layer 405 can be, for example, formed using aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like. The insulating layer 406 may be formed using an insulator having a function of supplying oxygen to the oxide semiconductor films, like the insulating layer 512 illustrated in FIGS. 13A to 13D.

<Transistors Mos1, Mos3, and Mos5>

The transistors Mos1, Mos3, and Mos5 have device structures similar to that of the OS transistor 502 illustrated in FIGS. 13A to 13D, and are s-channel transistors including a three-layer OS layer.

The insulating layer 407 functions as a gate insulating layer of the transistors Mos1, Mos3, and Mos5. An OS layer 490 and a conductive layer 432 are shared between the transistors Mos1 and Mos3. The OS layer 490 has a three-layer structure including OS layers 490a, 490b, and 490c. A conductive layer 431, the conductive layer 432, and a conductive layer 441 function as a source electrode, a drain electrode, and a gate electrode, respectively, of the transistor Mos1. The conductive layer 432, a conductive layer 433, and a conductive layer 442 function as a source electrode, a drain electrode, and a gate electrode, respectively, of the transistor Mos3.

An OS layer 491 of the transistor Mos5 has a three-layer structure including an OS layer 491a, an OS layer 491b, and the OS layer 490c. The OS layer 490c is shared between the OS layer 490 and the OS layer 491. A conductive layer 434, a conductive layer 435, and a conductive layer 443 function as a source electrode, a drain electrode, and a gate electrode, respectively, of the transistor Mos5.

<Wiring, Electrode>

The insulating layer 408 is formed to cover the transistors Mos1, Mos3, and Mos5. The insulating layer 409 is formed to cover the insulating layer 408. A wiring 451, a wiring 452, electrodes 453 to 457 are formed over an insulating layer. The wiring 451 is a power line for a high power supply potential VDD. The wiring 451 is a power supply line for a high power supply potential VSS.

A source of the transistor Mp1 (the impurity region 421) is electrically connected to the wiring 451 through a plug 471 and a plug 479. A source of the transistor Mp5 (the impurity region 424) is electrically connected to the wiring 451 through a plug 474 and a plug 483. The transistor Mos1 is electrically connected to the wiring 452 through a plug 478, and the transistor Mos5 is electrically connected to the wiring 452 through a plug 482.

The gate electrode (the conductive layer 441) of the transistor Mos1 and the gate electrode (the conductive layer 411) of the transistor Mp1 are each electrically connected to an electrode 455 through a plug (not shown). The gate electrode (the conductive layer 442) of the transistor Mos3 is electrically connected to an electrode 456 through a plug (not shown). The drain electrode (the conductive layer 432) is electrically connected to an electrode 454 through the plug 479. The gate electrode (the conductive layer 443) of the transistor Mos5 and the gate electrode (the conductive layer 412) of the transistor Mp5 are each electrically connected to the electrode 454 through a plug (not shown).

The drain (the impurity region 422) of the transistor Mp1 is electrically connected to the source (the conductive layer 433) of the transistor Mos3 through a plug 472 and a plug 475. The source electrode (the conductive layer 435) of the transistor Mos5 is electrically connected to the drain (the impurity region 423) of the transistor Mp5 through a plug 473 and a plug 477. The conductive layer 435 is electrically connected to the electrode 457 through a plug 481.

The insulating layer 410 is formed to cover the wiring 451, the wiring 452 and the electrodes 454 to 457. The electrodes 461 to 463 are formed over the insulating layer 410. The electrode 461 functions as an input terminal of the semiconductor device 102. The electrode 462 functions as an output terminal. The electrode 463 functions as an input terminal of the signal SLP. The electrode 461 is electrically connected to the electrode 455 through a plug (not shown). The electrode 462 is electrically connected to the electrode 457 through a plug 484. The electrode 463 is electrically connected to the electrode 456 through a plug (not shown).

The wiring 452, the electrodes 454 to 457, the electrodes 461 to 463, and plugs such as a plug 470 can be formed of a single-layer or multi-layer conductive layer. This conductive layer is preferably formed of a metal selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt), an alloy of the metal, or a compound containing the metal as its main component. It is particularly preferable to use a high-melting-point material that has both heat resistance and conductivity, such as tungsten or molybdenum. In addition, the plug is preferably formed using a low-resistance conductive material such as aluminum or copper. A Cu—Mn alloy is preferably used because manganese oxide formed at the interface with an insulator containing oxygen has a function of preventing Cu diffusion.

Embodiment 3

The logic circuit (logic cell) or clock tree described in Embodiment 1 can be incorporated in a variety of integrated circuits. Here, an example of the integrated circuits, that is, a central processing unit (CPU) will be described.

Figure 17:
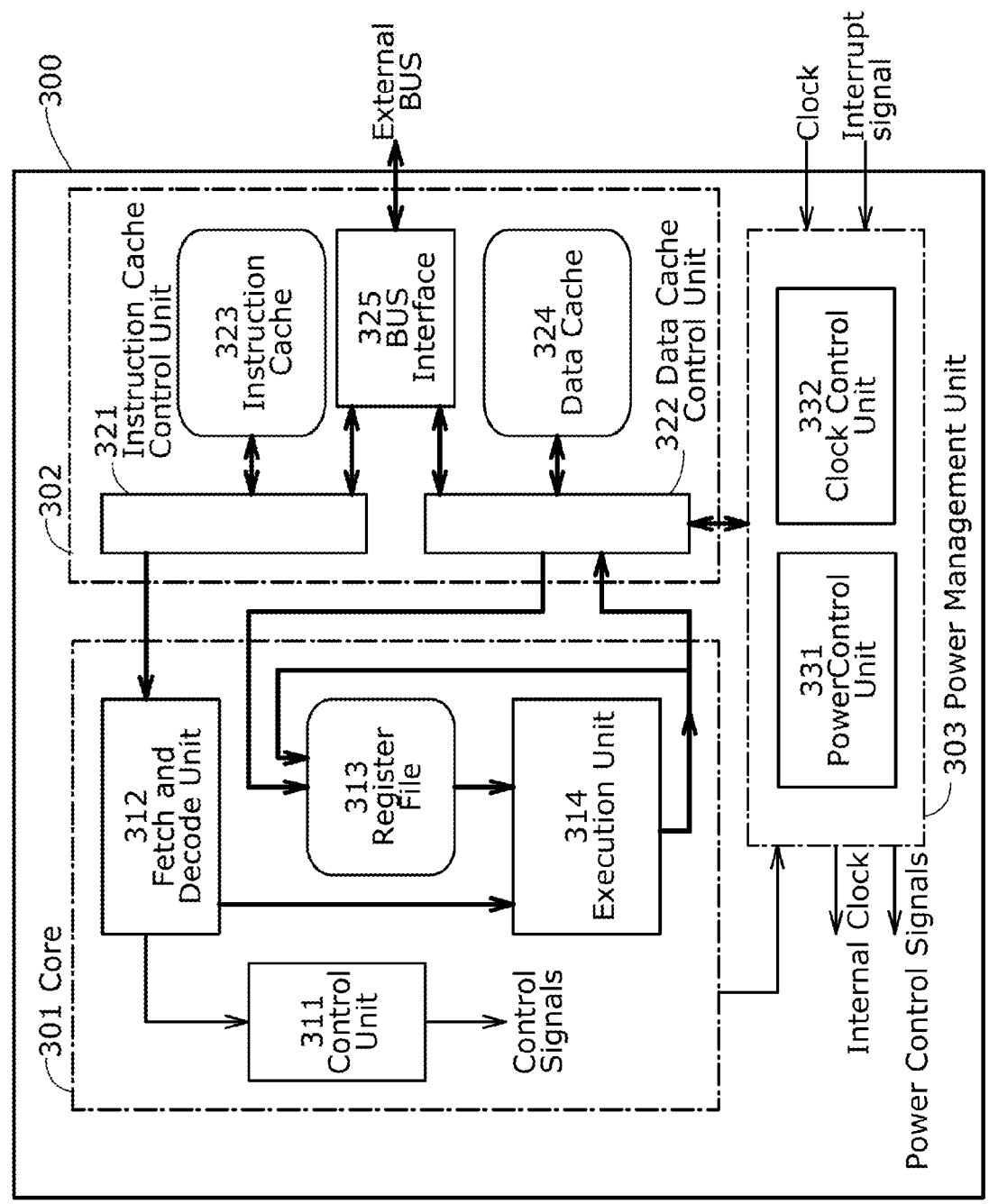
FIG. 17 is a block diagram illustrating an example of a processing unit (CPU)

FIG. 17 is a block diagram illustrating an example of a CPU. A CPU 300 illustrated in FIG. 17 includes a CPU core 301, a peripheral circuit 302, and a power management unit 303. The power management unit 303 includes a power supply control unit 331 and a clock control unit 332. The peripheral circuit 302 includes an instruction cache control unit 321, an instruction cache 323, a data cache control unit 322, a data cache 324, and a bus interface 325. The CPU core 301 includes a control unit 311, a fetch and decode unit 312, an execution unit 314, and a register file 313.

The semiconductor device of Embodiment 1 can be used in a logic circuit included in the CPU 300. Therefore, the semiconductor device of Embodiment 1 can be used in the power supply control unit 331, the clock control unit 332, the instruction cache control unit 321, the instruction cache 323, the data cache control unit 322, the data cache 324, the bus interface 325, the control unit 311, the fetch and decode unit 312, the execution unit 314 and/or the register file 313.

Furthermore, the semiconductor device of Embodiment 1 can be used as a clock tree for transmitting a clock signal. Accordingly, the CPU 300 with small size and small power consumption can be provided. Since the power consumption of an electronic device in which the CPU 300 is incorporated as an electronic part can be reduced, the CPU 300 is suitable for an electric appliance driven by a battery, for example.

The fetch and decode unit 312 has a function of acquiring an instruction from the main memory and the instruction cache 323 and decoding the instruction. The control unit 311 has a function of controlling the timing of data transmission and reception between the fetch and decode unit 312, the execution unit 314, the register file 313, and the outside of the CPU core 301 in accordance with fetched instructions or the like. The execution unit 314 includes an arithmetic logic unit (ALU), a shifter, a multiplier, and the like. The execution unit 314 has a function of performing a variety of arithmetic operations such as four arithmetic operations and logic operations.

The register file 313 includes a plurality of registers including a general purpose register and stores data that is read from the main memory and the data cache 324, the data output from the execution unit 314, or the like. The instruction cache 323 has a function of temporarily storing frequently used instruction. The data cache 324 has a function of temporarily storing frequently used data. The instruction cache control unit 321 controls the operation of the instruction cache 323, and the like. The data cache control unit 322 controls the operation of the data cache 324, and the like.

The bus interface 325 is connected to an external BUS, and functions as a path for data between the CPU 300 and devices outside the CPU 300.

The power management unit 303 performs control regarding electric power of the CPU 300. A control signal from the CPU core 301, an interrupt signal from the outside of the CPU 300, and the like are input to the power supply control unit 331, and outputs power control signals. For example, the CPU 300 has a plurality of power domains. In the case where the power switches are provided between the power source and each of the power domains, the power supply control unit 331 may have a function of controlling the operation of the power switches. For example, in the case where a voltage regulator is provided, the power supply control unit 331 may have a function of controlling the voltage regulator. The voltage regulator may be provided in the CPU 300 or outside the CPU 300. Alternatively, only part of the voltage regulator (for example, an inductor coil) may be provided outside the CPU 300.

A control signal from the CPU core 301 and a clock signal, an interrupt signal, and the like from the outside of the CPU 300 are input to the clock control unit 332, and the clock control unit 332 outputs an internal clock. For example, the CPU 300 may perform a coarse-grained clock gating by which clock is controlled for each large block such as the CPU core 301 and the peripheral circuit 302. Alternatively, the CPU 300 may perform a fine-grained clock gating by which clock is controlled for each small block including fewer flip-flops. By employing the clock tree of Embodiment 1, power consumption of the clock tree at the time of fine-grained clock gating can be reduced. Furthermore, since the state can be stored in the clock tree, the CPU 300 can be returned immediately to the normal operation mode.

The CPU 300 having the above-described configuration can perform power gating. An example of the flow of the power gating operation will be described.

The power gating is a technique for stopping the supply of power supply voltage to one or more of various circuits included in the CPU 300 in a period during which the CPU 300 does not execute processing or the like. The power gating is a technique for reducing power consumption by reducing DC power that is consumed when the power supply voltage is supplied. In the power gating, necessary data in the CPU 300 is saved when power supply is turned off. When the power supply is restarted, the saved data is restored and the instruction is executed again in the CPU core 301.

First, the CPU core 301 sets the mode of power gating by setting the value in the register inside the power supply control unit 331 in advance. The power gating is started, for example, by an instruction to the CPU core 301. After the CPU core 301 decodes the instruction, the CPU core 301 transmits a control signal for turning off the power to the power supply control unit 331. Next, the power supply control unit 331 saves data stored in a register included in the CPU 300, the register file 313, the instruction cache 323, the data cache 324, and the like or part of the data. Then, the power supply control unit 331 stops the supply of power to one or more of various circuits included in the CPU 300 by controlling the operation of power switches. An interrupt signal is input to the power management unit 303, thereby starting the supply of the power supply voltage to the circuits. A counter may be provided in the power supply control unit 331 to determine the timing of starting the supply of the power supply voltage regardless of input of an interrupt signal. Then, the CPU 300 restores the saved data. After that, the instruction is executed again in the CPU core 301.

A state retention register can be used as the register. As a result, data stored in the register can be saved in a state retention portion of the register without saving the data outside the CPU 300. The state retention portion to which the supply of power supply voltage is not stopped while power is off may be employed. The state retention portion may include a circuit formed of an oxide semiconductor transistor and a capacitor, and a memory circuit capable of holding data for a long time without power supply may be used. With such a structure, power and time are not required as compared to the case where data stored in the register is saved in the memory other than the register.

The register file 313, the instruction cache 323, and/or the data cache 324 may include the memory cell including the oxide semiconductor transistor described in the above embodiments. For example, in the case were a SRAM cell in which backup operation can be performed is included, the register file 313, the instruction cache 323, and/or the data cache 324 can save the stored data in the memory circuit for backup. As another structure, the register file 313, the instruction cache 323, and/or the data cache 324 may have a mode where they are supplied with a low power supply voltage at which data can be held (also referred to a low power supply voltage mode). When the supply power supply voltage to the register file 313, the instruction cache 323 and/or the data cache 324 is not stopped but the register file 313, the instruction cache 323 and/or the data cache 324 have the low power supply voltage mode at the time of power gating, the power consumption can be reduced. With such a structure, power and time can be reduced as compared to the case where data stored in the register file 313, the instruction cache 323, and/or the data cache 324 is saved outside the CPU 300. Alternatively, power and/or time can be reduced as compared to the case where the data stored in the instruction cache 323 and/or the data cache 324 is not saved at the time of power gating, and data and instruction are acquired from outside the CPU 300 as needed after the power is turned on.

Although a CPU is described here as an example of the processing unit, one embodiment of the present invention can be used in a variety of processing units. For example, one embodiment of the present invention can be used in an RFID tag, a graphics processing unit (GPU), a programmable logic device (PLD), a digital signal processor (DSP), a microcontroller unit (MCU), a custom LSI, and the like.

Embodiment 4

In this embodiment, an electronic part and electronic devices and the like including the electronic part will be described as examples of a semiconductor device.

<Example of Manufacturing Method of Electronic Component>

Figure 18A:
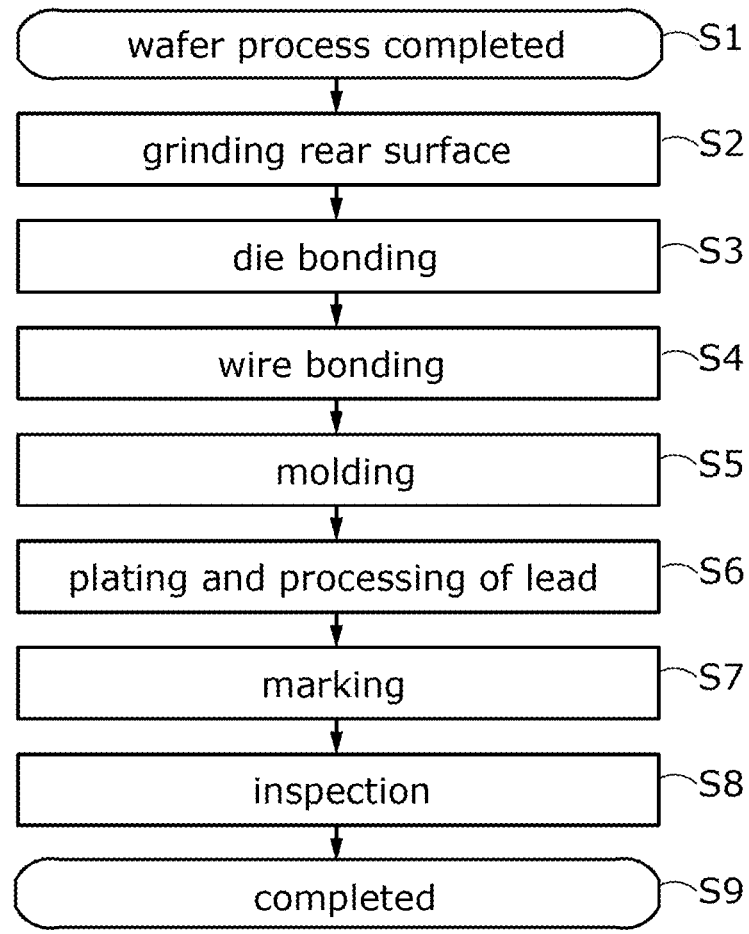
FIG. 18A is a flow chart showing an example of a method for manufacturing an electronic part.

FIG. 18A is a flow chart showing an example of a method for manufacturing an electronic part. The electronic part is also referred to as a semiconductor package or an IC package. This electronic part has a plurality of standards and names depending on a terminal extraction direction and a terminal shape. Examples of the electronic part are described in this embodiment.

A semiconductor device including a transistor is completed by integrating detachable components on a printed circuit board through the assembly process (post-process). The post-process can be finished through steps in FIG. 18A. Specifically, after an element substrate obtained in the wafer process is completed (Step S1), a rear surface of the substrate is ground (Step S2). The substrate is thinned in this step to reduce warpage or the like of the substrate in the wafer process and to reduce the size of the electronic part itself.

The rear surface of the substrate is ground so that the substrate is divided into a plurality of chips in a dicing process. Then, the divided chips are separately picked up to be mounted on and bonded to a lead frame in a die bonding step (Step S3). In this die bonding step, the chip is bonded to the lead frame by an appropriate method depending on a product, for example, bonding with a resin or a tape. Note that in the die bonding step, the chip may be mounted on an interposer to be bonded.

Then, wire bonding is performed to electrically connect lead of the lead frame to an electrode on the chip with a metal fine line (wire) (Step S4). A silver line or a gold line can be used as the metal fine line. Ball bonding or wedge bonding can be used as the wire bonding.

A molding step is performed to seal the wire bonded chip with an epoxy resin or the like (Step S5). With the molding step, the electronic part is filled with the resin, so that damage to a mounted circuit portion or wire due to mechanical external force can be reduced. Furthermore, deterioration in characteristics due to moisture or dust can be reduced.

Next, plate processing is performed on the lead of the lead frame. After that, the lead is cut and processed (Step S6). This plate processing prevents rust of the lead and facilitates soldering at the time of mounting the chip on a printed wiring board in a later step.

Next, printing (marking) is performed on a surface of the package (Step S7). Through the final inspection step (Step S8), the electronic part is completed (Step S9).

The above electronic part can include the semiconductor device described in the above embodiment. Thus, the electronic part can consume less power and have smaller size.

<Structure Examples of Electronic Part>

Figure 18B:
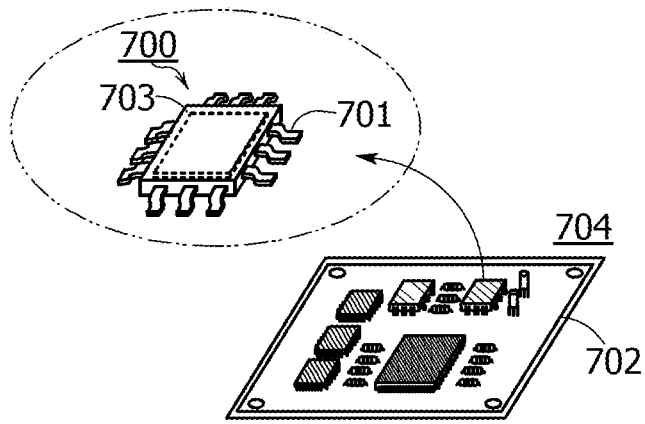
FIG. 18B is a schematic perspective view illustrating a structure example of an electronic part.

FIG. 18B is a schematic perspective view of the completed electronic part. FIG. 18B illustrates a schematic perspective view of a quad flat package (QFP) as an example of the electronic part. As illustrated in FIG. 18B, an electronic part 700 includes a lead 701 and a circuit portion 703. The electronic part 700 is mounted on a printed wiring board 702, for example. When a plurality of electronic parts 700 are used in combination and electrically connected to each other over the printed wiring board 702, the electronic parts 700 can be mounted on an electronic device. A completed circuit board 704 is provided in the electronic device or the like. The electronic part 700 can be used as, for example, a random access memory that stores data or a processing unit that executes a variety of types of processing, such as a microcontroller unit (MCU) or an RFID tag.

The electronic part 700 can be used as electronic part (an IC chip) of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. Such an electronic device can be used for display devices, personal computers (PCs), or image reproducing devices provided with recording media (typically, devices which reproduce the content of recording media such as digital versatile discs (DVDs) and have displays for displaying the reproduced images). Other examples of electronic device that can be equipped with the semiconductor device of one embodiment of the present invention are mobile phones, game machines including portable game machines, portable data appliances, e-book readers, cameras (e.g., video cameras and digital still cameras), wearable display devices or terminals (e.g., head mounted display devices, goggle-type display devices, glasses-type display devices, armband display devices, bracelet-type display devices, and necklace-type display devices), navigation systems, audio reproducing devices (e.g., car audio systems and digital audio players), copiers, facsimiles, printers, multifunction printers, automated teller machines (ATM), and vending machines. FIGS. 19A to 19H illustrate specific examples of these electronic devices.

<Structure Example of Electronic Device>

FIGS. 19A to 19F illustrate structure examples of an electronic device which includes a display portion and is driven by a battery. A portable game machine 900 illustrated in FIG. 19A includes a housing 901, a housing 902, a display portion 903, a display portion 904, a microphone 905, a speaker 906, an operation key 907, and the like. The display portion 903 is provided with a touch screen as an input device, which can be handled with a stylus 908 or the like.

Figure 19A:
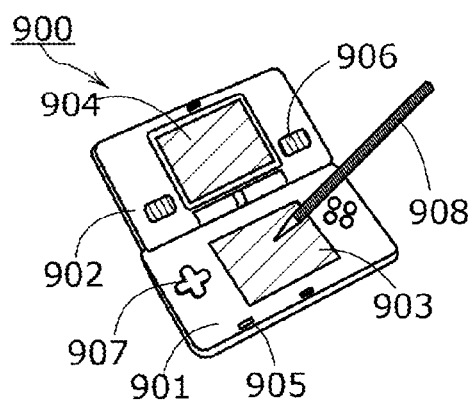
FIGS. 19A to 19H illustrate examples of an electronic device.
Figure 19B:
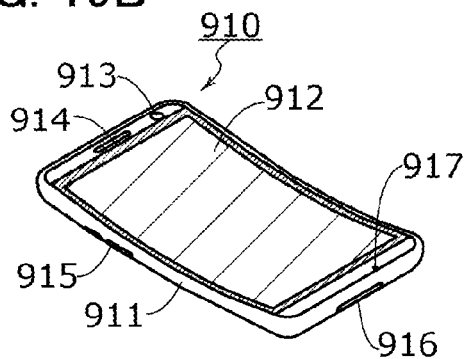

The information terminal 910 illustrated in FIG. 19B includes a housing 911, a display portion 912, a microphone 917, a speaker portion 914, a camera 913, an external connection portion 916, an operation button 915, and the like. A display panel that uses a flexible substrate and a touch screen are provided in the display portion 912. The information terminal 910 can be used as, for example, a smartphone, a mobile phone, a tablet information terminal, a tablet PC, or an e-book reader.

Figure 19C:
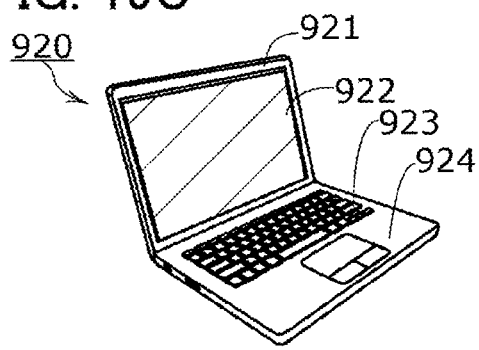

A notebook PC 920 illustrated in FIG. 19C includes a housing 921, a display portion 922, a keyboard 923, a pointing device 924, and the like.

Figure 19D:
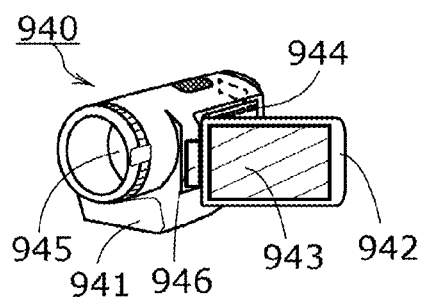

A video camera 940 illustrated in FIG. 19D includes a housing 941, a housing 942, a display portion 943, operation keys 944, a lens 945, a joint 946, and the like. The operation keys 944 and the lens 945 are provided in the housing 941, and the display portion 943 is provided in the housing 942. The housings 941 and 942 are connected to each other with the joint 946, and an angle between the housings 941 and 942 can be changed with the joint 946. The direction of an image on the display portion 943 may be changed and display and non-display of an image may be switched depending on the angle between the housings 941 and 942.

Figure 19E:
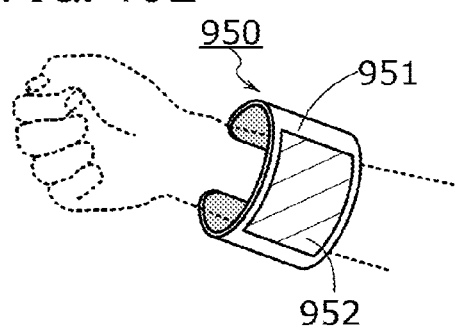

FIG. 19E illustrates an example of a bangle-type information terminal. An information terminal 950 includes a housing 951, a display portion 952, and the like. The display portion 952 is supported by the housing 951 having a curved surface. A display panel formed with a flexible substrate is provided in the display portion 952, whereby the information terminal 950 can be a user-friendly information terminal that is flexible and lightweight.

Figure 19F:
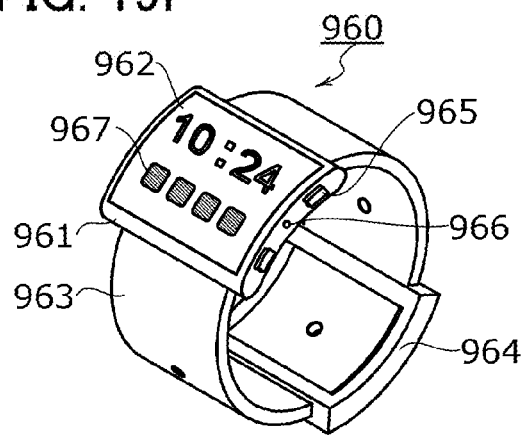

FIG. 19F illustrates an example of a watch-type information terminal. An information terminal 960 includes a housing 961, a display portion 962, a band 963, a buckle 964, an operation button 965, an input/output terminal 966, and the like. The information terminal 960 is capable of executing a variety of applications such as mobile phone calls, e-mailing, viewing and editing texts, music reproduction, Internet communication, and computer games.

The display surface of the display portion 962 is bent, and images can be displayed on the bent display surface. Further, the display portion 962 includes a touch sensor, and operation can be performed by touching the screen with a finger, a stylus, or the like. For example, by touching an icon 967 displayed on the display portion 962, an application can be started. With the operation button 965, a variety of functions such as time setting, power ON/OFF, ON/OFF of wireless communication, setting and cancellation of manner mode, and setting and cancellation of power saving mode can be performed. For example, the functions of the operation button 965 can be set by setting the operating system incorporated in the information terminal 960.

The information terminal 960 can employ near field communication that is a communication method based on an existing communication standard. In that case, for example, mutual communication between the information terminal 960 and a headset capable of wireless communication can be performed, and thus hands-free calling is possible. Moreover, the information terminal 960 includes the input/output terminal 966, and data can be directly transmitted to and received from another information terminal via a connector. Power charging through the input/output terminal 966 is possible. Note that the charging operation may be performed by wireless power feeding without using the input/output terminal 966.

Figure 19G:
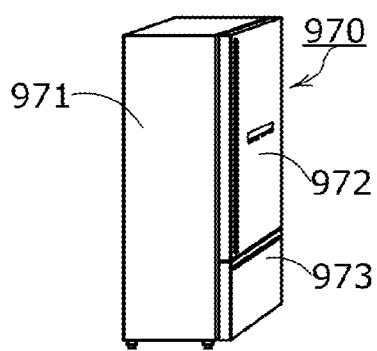

FIG. 19G illustrates an electric refrigerator-freezer as an example of a home electric device. An electric refrigerator-freezer 970 includes a housing 971, a refrigerator door 972, a freezer door 973, and the like.

Figure 19H:
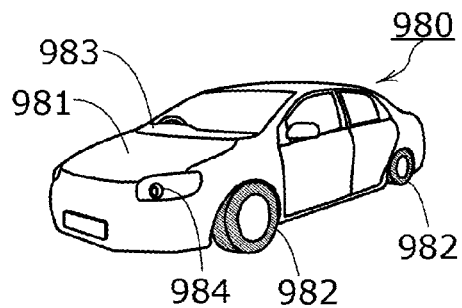

FIG. 19H is an external view illustrating a structure example of a motor vehicle. A motor vehicle 980 includes a car body 981, wheels 982, a dashboard 983, lights 984, and the like.

An electronic part including the semiconductor device described in the above embodiment is provided in the electronic devices described in this embodiment. Thus, an electronic device that consumes less power and has smaller size can be provided.

This application is based on Japanese Patent Application serial no. 2014-098150 filed with Japan Patent Office on May 9, 2014, the entire contents of which are hereby incorporated by reference.

What is claimed is:

1. A clock tree comprising a plurality of inverter circuits comprising:
a plurality of levels comprising:
a first inverter circuit in at least one odd-numbered level; and
a second inverter circuit in at least one even-numbered level,
wherein a first power supply potential is input to a source of a p-channel transistor of the first inverter circuit,
wherein a second power supply potential is input to a source of an n-channel transistor of the first inverter circuit,
wherein the first power supply potential is input to a source of a p-channel transistor of the second inverter circuit,
wherein the second power supply potential is input to a source of an n-channel transistor of the second inverter circuit,
wherein the first power supply potential is higher than the second power supply potential,
wherein the input of the first power supply potential to the source of the p-channel transistor of the first inverter circuit can be blocked, and
wherein a semiconductor region in each of the n-channel transistors of the first inverter circuit and the second inverter circuit includes an oxide semiconductor layer.

2. A clock tree comprising a plurality of inverter circuits comprising:
a plurality of levels comprising:
a first inverter circuit in at least one odd-numbered level; and
a second inverter circuit in at least one even-numbered level,
wherein a first power supply potential is input to a source of a p-channel transistor of the first inverter circuit,
wherein a second power supply potential is input to a source of an n-channel transistor of the first inverter circuit,
wherein the first power supply potential is input to a source of a p-channel transistor of the second inverter circuit,
wherein the second power supply potential is input to a source of an n-channel transistor of the second inverter circuit,
wherein an electrical connection between a drain of the p-channel transistor of the first inverter circuit and an output node of the first inverter circuit can be blocked,
wherein the first power supply potential is higher than the second power supply potential, and
wherein a semiconductor region in each of the n-channel transistors of the first inverter circuit and the second inverter circuit includes an oxide semiconductor layer.

3. The clock tree according to claim 1, wherein each of the oxide semiconductor layers of the n-channel transistor of the first inverter circuit and the n-channel transistor of the second inverter circuit comprises In and Zn.

4. The clock tree according to claim 2, wherein each of the oxide semiconductor layers of the n-channel transistor of the first inverter circuit and the n-channel transistor of the second inverter circuit comprises In and Zn.

5. A clock tree comprising a plurality of inverter circuits comprising:
a first inverter circuit; and
a second inverter circuit,
wherein an output node of the first inverter circuit is electrically connected to an input node of the second inverter circuit,
wherein a first power supply potential is input to a source of a p-channel transistor of the first inverter circuit,
wherein a second power supply potential is input to a source of an n-channel transistor of the first inverter circuit,
wherein the first power supply potential is input to a source of a p-channel transistor of the second inverter circuit,
wherein the second power supply potential is input to a source of an n-channel transistor of the second inverter circuit,
wherein the first power supply potential is higher than the second power supply potential,
wherein the input of the first power supply potential to the source of the p-channel transistor of the first inverter circuit can be blocked, and
wherein a semiconductor region in each of the n-channel transistors of the first inverter circuit and the second inverter circuit includes an oxide semiconductor layer.

6. A clock tree comprising a plurality of inverter circuits comprising:
a first inverter circuit; and
a second inverter circuit,
wherein an output node of the first inverter circuit is electrically connected to an input node of the second inverter circuit,
wherein a first power supply potential is input to a source of a p-channel transistor of the first inverter circuit,
wherein a second power supply potential is input to a source of an n-channel transistor of the first inverter circuit,
wherein the first power supply potential is input to a source of a p-channel transistor of the second inverter circuit,
wherein the second power supply potential is input to a source of an n-channel transistor of the second inverter circuit,
wherein an electrical connection between a drain of the p-channel transistor of the first inverter circuit and the output node of the first inverter circuit can be blocked,
wherein the first power supply potential is higher than the second power supply potential, and
wherein a semiconductor region in each of the n-channel transistors of the first inverter circuit and the second inverter circuit includes an oxide semiconductor layer.

7. The clock tree according to claim 5, wherein each of the oxide semiconductor layers of the n-channel transistor of the first inverter circuit and the n-channel transistor of the second inverter circuit comprises In and Zn.

8. The clock tree according to claim 6, wherein each of the oxide semiconductor layers of the n-channel transistor of the first inverter circuit and the n-channel transistor of the second inverter circuit comprises In and Zn.

9. An electronic part comprising:
a circuit portion comprising the clock tree according to claim 1; and
a wire electrically connected to the circuit portion.

10. An electronic device comprising:
the electronic part according to claim 9; and
at least one of a microphone, a speaker, a display portion, and an operation key.

* * * * *

UNITED STATES PATENT AND TRADEMARK OFFICE
CERTIFICATE OF CORRECTION

PATENT NO.       : 9,515,661 B2
APPLICATION NO.  : 14/705619
DATED            : December 6, 2016
INVENTOR(S)      : Kiyoshi Kato It is certified that error appears in the above-identified patent and that said Letters Patent is hereby corrected as shown below:

In the Specification

Column 4, Line 10, after "X" insert --,--;

Column 4, Line 15, after "X" insert --,--;

Column 4, Line 16, after "X" insert --,--;

Column 10, Line 47, replace "Mph1" with --Mp11--;

Column 11, Line 67, replace "NV" with --INV--;

Column 12, Line 8, replace "all" with --a11--;

Column 12, Line 41, replace "all" with --a11--;

Column 13, Line 13, replace "NV" with --INV--;

Column 13, Line 37, replace "all" with --a11--;

Column 13, Line 46, replace "all" with --a11--;

Column 13, Line 67, replace "all" with --a11--;

Column 14, Line 10, replace "NV" with --INV--;

Column 14, Line 15, replace "all" with --a11--;

Signed and Sealed this
Fourth Day of July, 2017

Joseph Matal
*Performing the Functions and Duties of the
Under Secretary of Commerce for Intellectual Property and
Director of the United States Patent and Trademark Office*

CERTIFICATE OF CORRECTION (continued)
U.S. Pat. No. 9,515,661 B2

Column 14, Line 37, replace "NV" with --INV--;

Column 14, Line 46, replace "all" with --a11--;

Column 14, Line 57, replace "all" with --a11--;

Column 15, Line 7, replace "all" with --a11--; and

Column 15, Line 8, replace "NV" with --INV--.